US 12,349,296 B2

(12) United States Patent  
Cho et al.

(10) Patent No.: US 12,349,296 B2  
(45) Date of Patent: Jul. 1, 2025

(54) FLEXIBLE DISPLAY AND ELECTRONIC DEVICE INCLUDING THE SAME

(71) Applicant: SAMSUNG ELECTRONICS CO., LTD., Suwon-si (KR)

(72) Inventors: Hyunmoon Cho, Suwon-si (KR); Jinhyun Park, Suwon-si (KR); Seungtaek Oh, Suwon-si (KR); Sunghwan Lim, Suwon-si (KR); Jongchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 239 days.

(21) Appl. No.: 18/314,397

(22) Filed: May 9, 2023

(65) Prior Publication Data

US 2023/0403808 A1   Dec. 14, 2023

Related U.S. Application Data

(63) Continuation of application No. PCT/KR2023/005598, filed on Apr. 25, 2023.

(30) Foreign Application Priority Data

Jun. 8, 2022 (KR) .................. 10-2022-0069770  
Aug. 19, 2022 (KR) .................. 10-2022-0104069

(51) Int. Cl.  
*H05K 5/02* (2006.01)  
*G06F 1/16* (2006.01)

(52) U.S. Cl.  
CPC ......... *H05K 5/0217* (2013.01); *G06F 1/1624* (2013.01); *G06F 1/1652* (2013.01)

(58) Field of Classification Search  
CPC .... H05K 5/0217; G06F 1/1624; G06F 1/1652  
See application file for complete search history.

(56) References Cited

U.S. PATENT DOCUMENTS

| 9,929,374 B2 | 3/2018 | Jin et al. |
| 9,958,900 B2 * | 5/2018 | Han ................. G06F 1/1626 |

(Continued)

FOREIGN PATENT DOCUMENTS

| KR | 20150061965 A | 6/2015 |
| KR | 20160103681 A | 9/2016 |

(Continued)

OTHER PUBLICATIONS

Search Report dated Aug. 17, 2023 in International Patent Application No. PCT/KR2023/005598 and English-language translation.

*Primary Examiner* — Sagar Shrestha  
(74) *Attorney, Agent, or Firm* — Nixon & Vanderhye, P.C.

(57) ABSTRACT

An example flexible display includes a panel layer and a cover layer disposed on one surface of the panel layer. The cover layer includes a first portion and a second portion that extends from the first portion in a first direction. The first portion includes a first base portion having a first thickness and a first connecting portion that extends from the first base portion and has a gradually decreasing thickness. The second portion includes a second base portion that is connected with the first connecting portion and that has a second thickness smaller than the first thickness and a reinforcing portion that protrudes from an edge of the second base portion that faces in a second direction perpendicular to the first direction. The reinforcing portion includes an edge portion that protrudes from a partial region of the second base portion to have a third thickness and a second connecting portion that extends from the edge portion toward the second base portion and has a gradually decreasing thickness.

20 Claims, 29 Drawing Sheets

(56) References Cited

U.S. PATENT DOCUMENTS

| | | | |
|---|---|---|---|
| 10,014,490 | B2 | 7/2018 | Jin et al. |
| 10,211,416 | B2 | 2/2019 | Jin et al. |
| 10,295,818 | B2 | 5/2019 | Nam et al. |
| 10,367,173 | B1 | 7/2019 | Wu et al. |
| 10,522,783 | B2* | 12/2019 | Jo .................. H10K 59/873 |
| 10,535,826 | B2 | 1/2020 | Kim et al. |
| 10,707,429 | B2* | 7/2020 | Jin .................. H10K 77/111 |
| 10,734,612 | B2 | 8/2020 | Wu et al. |
| 11,181,732 | B2 | 11/2021 | Nam et al. |
| 11,288,986 | B2 | 3/2022 | Ha et al. |
| 11,355,738 | B2 | 6/2022 | Wu et al. |
| 11,363,733 | B2* | 6/2022 | Choi ...................... C09J 7/00 |
| 11,581,510 | B2* | 2/2023 | Min ................ H10K 59/873 |
| 11,594,702 | B2 | 2/2023 | Kim et al. |
| 11,678,452 | B2* | 6/2023 | Park ........................ G02B 1/14 428/156 |
| 2015/0085432 | A1* | 3/2015 | Memering ............ H01Q 1/2258 361/679.01 |
| 2016/0062405 | A1* | 3/2016 | Mylvaganam ........ G04B 39/006 427/259 |
| 2018/0039815 | A1* | 2/2018 | Jung ........................ G06F 3/044 |
| 2018/0097199 | A1 | 4/2018 | Jo et al. |
| 2018/0175311 | A1 | 6/2018 | Jin et al. |
| 2019/0140202 | A1 | 5/2019 | Jin et al. |
| 2019/0305256 | A1 | 10/2019 | Wu et al. |
| 2020/0292731 | A1* | 9/2020 | Park ........................ G06F 1/1641 |
| 2020/0324521 | A1* | 10/2020 | Park .......................... B24B 7/24 |
| 2020/0335718 | A1 | 10/2020 | Xie et al. |
| 2020/0335729 | A1 | 10/2020 | Wu et al. |
| 2022/0263053 | A1 | 8/2022 | Wu et al. |
| 2023/0259167 | A1* | 8/2023 | Ahn ........................ B32B 27/36 |

FOREIGN PATENT DOCUMENTS

| | | |
|---|---|---|
| KR | 20190029821 A | 3/2019 |
| KR | 10-2019-0085208 | 7/2019 |
| KR | 102068685 | 1/2020 |
| KR | 10-2021-0054650 | 5/2021 |
| KR | 102261882 B1 | 6/2021 |
| KR | 10-2022-0068132 | 5/2022 |

\* cited by examiner

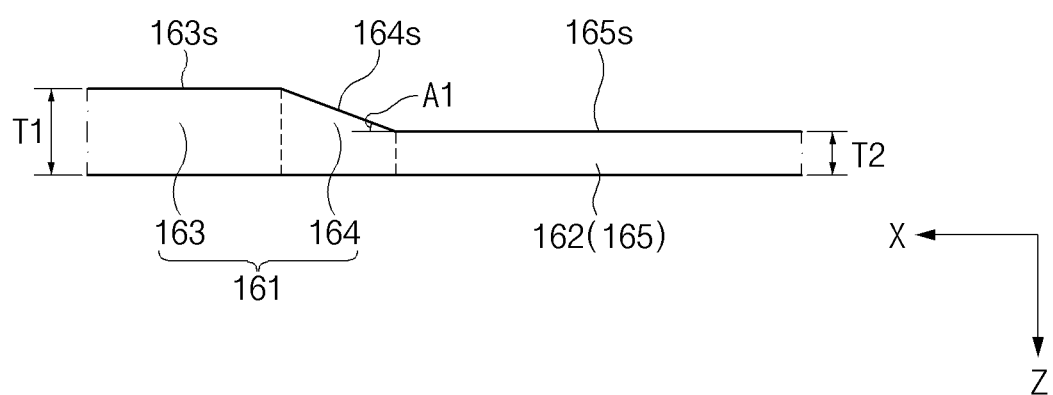
F I G. 7B

FLEXIBLE DISPLAY AND ELECTRONIC DEVICE INCLUDING THE SAME

CROSS-REFERENCE TO RELATED APPLICATIONS

This application is a continuation of International Application No. PCT/KR2023/005598, designating the United States, filed on Apr. 25, 2023, in the Korean Intellectual Property Receiving Office and claiming priority to Korean Patent Application No. 10-2022-0069770, filed Jun. 8, 2022, in the Korean Intellectual Property Office and to Korean Application No. 10-2022-0104069, filed Aug. 19, 2022, in the Korean Intellectual Property Office. The disclosures of each of these applications are incorporated by reference herein in their entireties.

BACKGROUND

Field

The disclosure relates to a flexible display and an electronic device including the same.

Description of Related Art

An electronic device may include a flexible display. Such electronic devices may, for example, include a foldable electronic device, a slidable electronic device, or a rollable electronic device. The electronic device may be deformed to extend or reduce a display region visually exposed on an outer surface of the electronic device. For example, the flexible display may be disposed in the electronic device in a bendable, foldable, or rollable form.

SUMMARY

In a case of the electronic device configured such that the flexible display performs a sliding, bending, and/or rolling operation, a compressive load may be concentrated on an edge portion of the display when the electronic device is driven. As the compressive load is concentrated, a buckling phenomenon may occur in the display, which may lead to delamination or damage of the display.

According to various example embodiments of the disclosure, the strength of an edge portion of a display may be improved by forming a reinforcing portion on a glass cover (e.g., thin glass) applied to the display.

A flexible display according to an example embodiment may include a panel layer and a cover layer disposed on one surface of the panel layer. The cover layer includes a first portion and a second portion that extends from the first portion in a first direction. The first portion includes a first base portion having a first thickness and a first connecting portion that extends from the first base portion and has a gradually decreasing thickness. The second portion includes a second base portion that is connected with the first connecting portion and that has a second thickness smaller than the first thickness and a reinforcing portion that protrudes from an edge of the second base portion that faces in a second direction perpendicular to the first direction. The reinforcing portion includes an edge portion that protrudes from a partial region of the second base portion to have a third thickness and a second connecting portion that extends from the edge portion toward the second base portion and has a gradually decreasing thickness.

A slidable electronic device according to an example embodiment may include a first structure, a second structure connected to the first structure so as to slide, and a display configured such that a size of a region exposed on a front surface of the electronic device is changed in response to sliding of the second structure relative to the first structure, the display being formed in a structure in which a plurality of layers are stacked. The plurality of layers includes include a panel layer and a cover layer disposed on one surface of the panel layer, and the cover layer includes a first portion and a second portion that extends from the first portion in a first direction. The first portion includes a first base portion having a first thickness and a first connecting portion that extends from the first base portion and has a gradually decreasing thickness, and the second portion includes a second base portion that is connected with the first connecting portion and that has a second thickness smaller than the first thickness and a reinforcing portion that protrudes from an edge of the second base portion that faces in a second direction perpendicular to the first direction. The reinforcing portion includes an edge portion that protrudes from a partial region of the second base portion to have a third thickness and a second connecting portion that extends from the edge portion toward the second base portion and has a gradually decreasing thickness.

A foldable electronic device according to an example embodiment may include a first housing, a second housing connected to the first housing so as to be rotatable, and a display disposed in the first housing and the second housing and partially folded or unfolded in response to relative rotation of the first housing and the second housing, the display being formed in a structure in which a plurality of layers are stacked. The plurality of layers includes a panel layer and a cover layer disposed on one surface of the panel layer, and the cover layer includes a first portion and a second portion that extends from the first portion in a first direction. The first portion includes a first base portion having a first thickness and a first connecting portion that extends from the first base portion and has a gradually decreasing thickness, and the second portion includes a second base portion that is connected with the first connecting portion and that has a second thickness smaller than the first thickness and a reinforcing portion that protrudes from an edge of the second base portion that faces in a second direction perpendicular to the first direction. The reinforcing portion includes an edge portion that protrudes from a partial region of the second base portion to have a third thickness and a second connecting portion that extends from the edge portion toward the second base portion and has a gradually decreasing thickness.

An electronic device according to the various example embodiments may improve the strength of the edge portion of the display by forming a reinforcing portion on the glass cover (e.g., thin glass) applied to the display.

In addition, the disclosure may provide various effects that are directly or indirectly recognized.

BRIEF DESCRIPTION OF THE DRAWINGS

The above and/or other aspects of the disclosure will be more apparent by describing certain embodiments of the disclosure with reference to the accompanying drawings, in which:

FIG. 7B is a sectional view of the example cover layer in a width direction according to various embodiments;

With regard to description of the drawings, identical or similar reference numerals may be used to refer to identical or similar components.

DETAILED DESCRIPTION

Hereinafter, various example embodiments of the disclosure may be described with reference to accompanying drawings. Accordingly, those of ordinary skill in the art will recognize that modifications, equivalents, and/or alternatives on the various example embodiments described herein can be variously made without departing from the scope and spirit of the disclosure.

Figure 1:
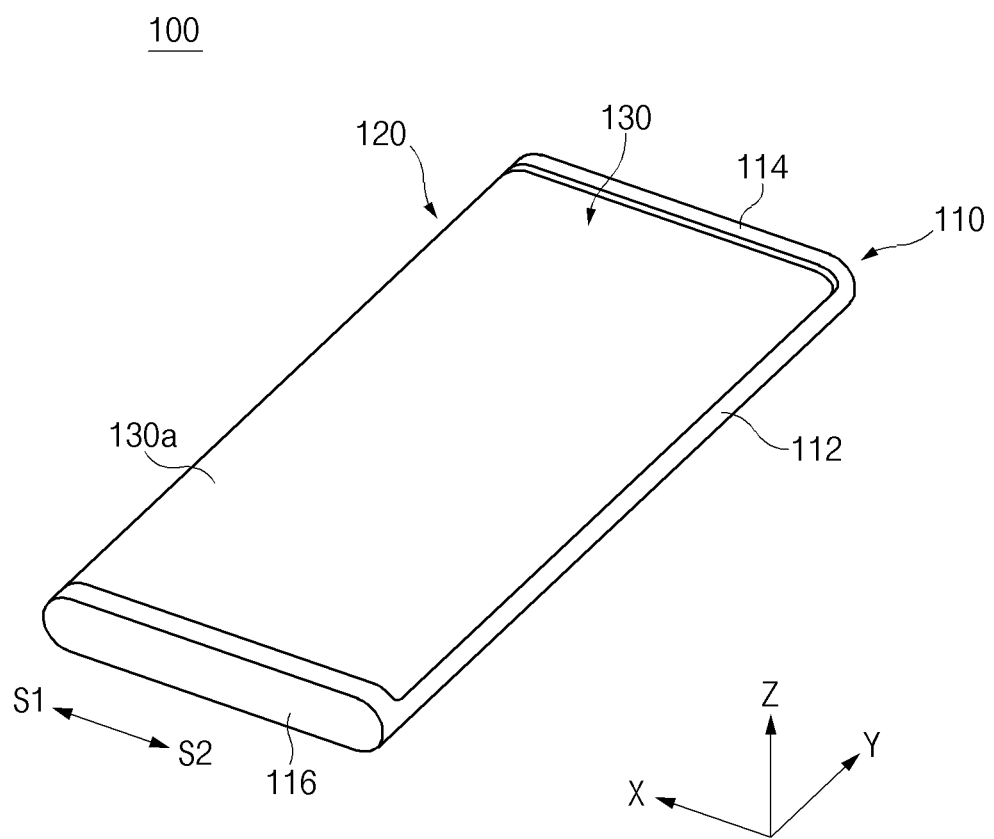
FIG. 1 is a view illustrating a retracted state of an example electronic device according to various embodiments.
Figure 2:
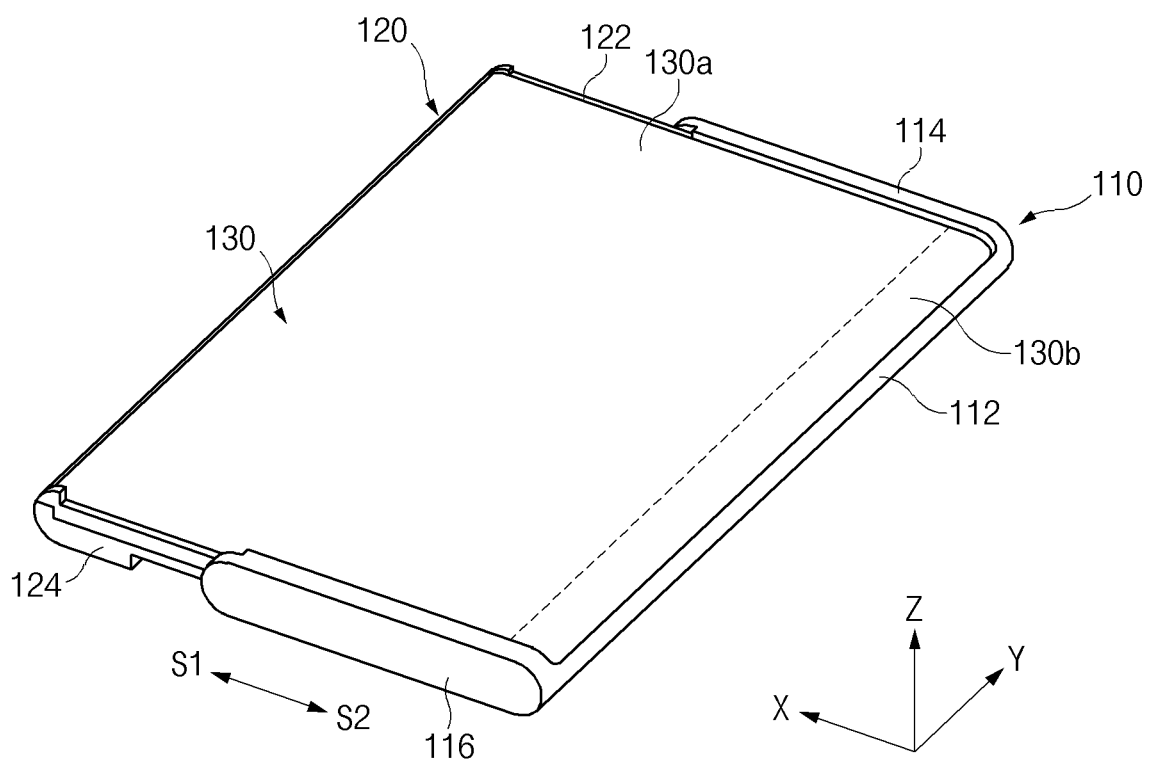
FIG. 2 is a view illustrating an extended state of the example electronic device according to various embodiments.

FIG. 1 is a view illustrating a default state of an example electronic device according to various embodiments. FIG. 2 is a view illustrating an extended state of the example electronic device according to various embodiments.

Referring to FIGS. 1 and 2, the electronic device 100 according to an embodiment may include a first structure 110, a second structure 120, and a display 130.

The electronic device 100 of FIGS. 1 and 2 may be an electronic device of a slidable type or a rollable type and may include a default state (e.g., a closed mode, a reduction mode, or a slide-in mode) and an extended state (e.g., an open mode or a slide-out mode). The default state and the extended state of the electronic device 100 may be determined depending on the position of the second structure 120 relative to the first structure 110. The electronic device 100 may be changed between the default state and the extended state by a user operation or a mechanical operation.

The default state may refer, for example, to a state in which the area (or size) of the display 130 visually exposed on a front surface (e.g., a surface facing in the +z-axis direction) of the electronic device 100 is relatively reduced. The extended state may refer, for example, to a state in which the area (or size) of the display 130 visually exposed on the front surface of the electronic device 100 is relatively extended. For example, the area of the display 130 visually exposed on the front surface of the electronic device 100 in the extended state may be larger than the area of the display 130 visually exposed on the front surface of the electronic device 100 in the default state, and the area of the display 130 visually exposed on the front surface of the electronic device 100 may be largest when the electronic device 100 is in the extended state. The electronic device 100 may be deformed through a plurality of intermediate states defined between the default state and the extended state. For example, the plurality of intermediate states may refer, for example, to a plurality of states in which the area of the display 130 visually exposed on the front surface has a medium (or intermediate) size that is larger than that in the default state and smaller than that in the extended state.

The default state may refer, for example, to a closed state in which a first side surface 122 and a second side surface 124 of the second structure 120 are located in the first structure 110 so that the second structure 120 is closed to the first structure 110. The extended state may refer, for example, to an opened state in which the first side surface 122 and the second side surface 124 of the second structure 120 move out of the first structure 110 so that the second structure 120 is open to the first structure 110.

The first structure 110 and the second structure 120 may be coupled to slide relative to each other. The second structure 120 may be coupled to one side of the first structure 110 so as to slide. For example, the first structure 110 may be a fixed structure, and the second structure 120 may be a structure movable relative to the first structure 110. The second structure 120 may be coupled to the one side of the first structure 110 (e.g., the +x-axis direction) so as to slide relative to the first structure 110 in opposite directions S1 and S2 (e.g., the +x/−x-axis directions).

According to various embodiments, the first structure 110 may refer, for example, to a fixed member, a fixed housing, a fixed case, or a main body. The second structure 120 may refer, for example, to a sliding structure, a sliding member (a slider), a sliding housing, a sliding case, or a sliding body.

The electronic device 100 may be changed between the default state and the extended state as the second structure 120 slides relative to the first structure 110. For example, the electronic device 100 in the default state (e.g., the state of FIG. 1) may be changed to the extended state (e.g., the state of FIG. 2) as the second structure 120 moves relative to the first structure 110 in the first direction S1. In contrast, the electronic device 100 in the extended state may be changed to the default state as the second structure 120 moves relative to the first structure 110 in the second direction S2.

The size of a region of the display 130 exposed on the front surface of the electronic device 100 may be changed in response to a sliding operation of the second structure 120. In a state in which the display 130 is supported by at least one of the first structure 110 or the second structure 120, at least a portion of the display 130 may rotate and/or linearly move based on the sliding operation of the second structure 120, and thus the region of the display 130 exposed on the front surface of the electronic device 100 may be extended or retracted. The display 130 may at least partially include a flexible portion. For example, the display 130 may be a flexible display.

The display 130 may include a default region 130a and an extended region 130b that extends from the default region 130a in one direction (e.g., the −x-axis direction in the drawings). The default region 130a may form the front surface of the electronic device 100. For example, the default region 130a may remain exposed on the front surface irrespective of the states of the electronic device 100. The area of the extended region 130b exposed on the front surface of the electronic device 100 may vary depending on the states of the electronic device 100. For example, in any states between the default state and the extended state and in the extended state, at least a portion of the extended region 130b may form the front surface of the electronic device 100 together with the default region 130a. The area of the extended region 130b exposed on the front surface of the electronic device 100 may vary depending on the distance by which the second structure 120 slides relative to the first structure 110. For example, as the second structure 120 moves in the first direction S1 in the default state, the size of the extended region 130b exposed on the front surface of the electronic device 100 may be gradually increased. In contrast, as the second structure 120 moves in the second direction S2 in the extended state, the size of the extended region 130b exposed on the front surface of the electronic device 100 may be gradually decreased.

The default region 130a and the extended region 130b of the display 130 may be distinguished from each other depending on whether the default region 130a and the extended region 130b are exposed on the front surface of the electronic device 100 in the default state. The default region 130a may refer, for example, to a partial region of the display 130 visually exposed on the front surface of the electronic device 100 in the default state. The extended region 130b may refer, for example, to another region of the display 130 that is located in an inner space of the first structure 110 in the default state so as not to be exposed on the front surface of the electronic device 100 and is at least partially moved out of the inner space of the first structure 110 in the extended state so as to be visually exposed on the front surface of the electronic device 100. In the illustrated embodiment, the inner space of the first structure 110 may be formed by a plate part 112 and a first sidewall part 114 and a second sidewall part 116 formed on opposite sides of the plate part 112 in a lengthwise direction of the plate part 112 (e.g., a direction perpendicular to the sliding directions S1 and S2 or the y-axis direction).

In example embodiments of the disclosure, the default region 130a and the extended region 130b of the display 130 are not physically separated regions and do not mean that the shapes or properties differ from each other. For example, the extended region 130b may be understood as indicating the remaining region other than the default region 130a in the entire region of the display 130. In various embodiments, the default region 130a may be understood, for example, as a fixedly exposed display region or a main display region, and the extended region 130b may be understood as a variably exposed display region or a sub-display region.

According to the illustrated embodiment, the direction in which the extended region 130b extends from the default region 130a may be opposite to the first sliding direction S1 in which the second structure 120 moves when the electronic device 100 is extended. For example, the extended region 130b may extend from the default region 130a in the second sliding direction S2. As the second structure 120 slides relative to the first structure 110, the extended region 130b may move into the first structure 110 (e.g., a slide-in operation), or may move out of the first structure 110 (e.g., a slide-out operation).

However, the electronic device 100 and the display 130 are not limited to the illustrated embodiment. According to various embodiments, the electronic device 100 may be configured such that the extended region 130b of the display 130 slides into the second structure 120, or slides out of the second structure 120, depending on a sliding operation of the second structure 120. In this case, the extended region 130b of the display 130 may extend from the default region 130a in the first sliding direction S1. The extended region 130b may be located in the second structure 120 in the default state, and, when the electronic device 100 is changed to the extended state, the extended region 130b may move out of the second structure 120 and may be exposed on the front surface of the electronic device 100.

The display 130 may form a screen display region that is visually exposed on the front surface of the electronic device 100 and on which predetermined visual information (or a screen) is displayed. For example, in the default state, the screen display region may be formed by the default region 130a. In the extended state, the screen display region may be formed by at least a portion of the extended region 130b and the default region 130a. In the extended state, the electronic device 100 may display a screen on the default region 130a and a portion of the extended region 130b and thus may provide a screen display region that is extended or enlarged when compared to that in the default state.

The default state may include a state in which an exposed region of the display 130 has a first size, and the extended state may include a state in which the exposed region of the display 130 has a second size greater than the first size. For example, the first size may be a minimum size of the exposed region of the display 130, and the second size may be a maximum size of the exposed region of the display 130. In a deformation operation of the electronic device 100, a plurality of intermediate states may be defined between the default state and the extended state. The plurality of intermediate states may include any states in which the size of the exposed region of the display 130 is larger than the first size in the default state and smaller than the second size in the extended state.

The electronic device 100 may maintain the current deformed state even though an external force is not applied in the default state and the extended state. According to various embodiments, the electronic device 100 may be configured to maintain the shape even though an external force is not applied in at least one of the plurality of intermediate states. For example, at least one free-stop state may be provided between the default state and the extended state, and in the free-stop state, the electronic device 100 may maintain the current state even without an external force.

Figure 3A:
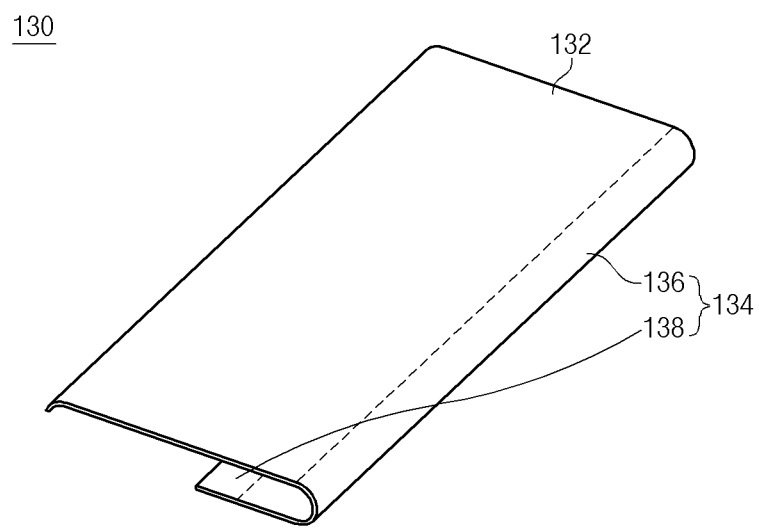
FIGS. 3A and 3B are views illustrating a display of the example electronic device according to various embodiments.
Figure 3B:
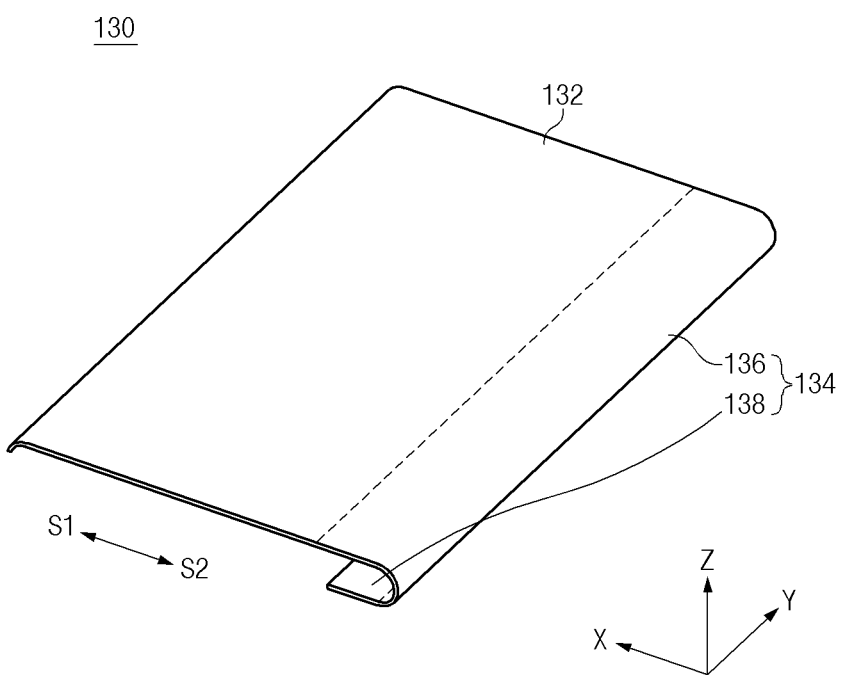
Figure 4:
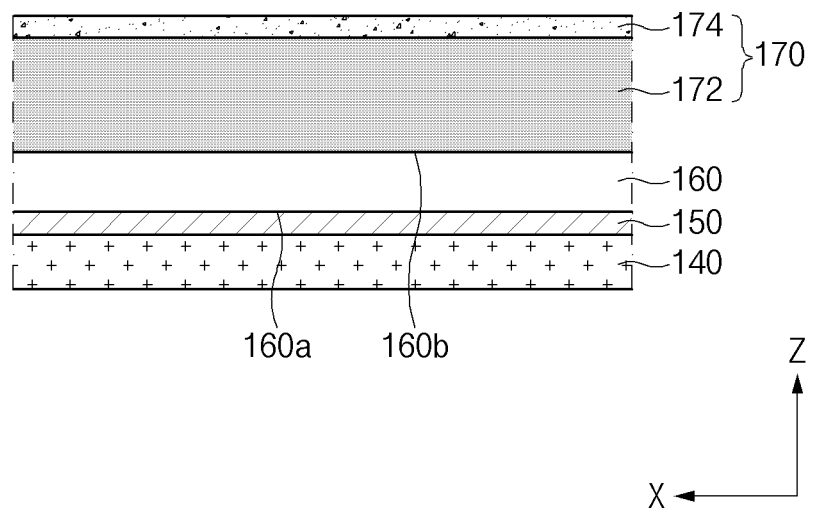
FIG. 4 is a view illustrating a plurality of layers of the example display according to various embodiments.

FIGS. 3A and 3B are views illustrating the display of the example electronic device according to various embodiments. FIG. 4 is a view illustrating a plurality of layers of the display according to various embodiments.

FIG. 3A illustrates the shape of the display 130 when the electronic device (e.g., the electronic device 100 of FIGS. 1 and 2) is in the default state. FIG. 3B illustrates the shape of the display 130 when the electronic device 100 is in the extended state. For example, FIG. 3A may be a view in which the remaining components other than the display 130 are omitted in the electronic device 100 of FIG. 1, and FIG. 3B may be a view in which the remaining components other than the display 130 are omitted in the electronic device 100 of FIG. 2. FIG. 4 illustrates a stacked structure of the plurality of layers included in the display 130.

Referring to FIGS. 3A and 3B, the display 130 of the electronic device 100 according to an embodiment (e.g., the display 130 of FIGS. 1 and 2) may include a fixed part 132 having a fixed shape and a variable part 134 extending from the fixed part 132 and having a variable shape.

The shape of the fixed part 132 may be fixedly maintained irrespective of the states of the electronic device 100. For example, at least a portion of the fixed part 132 may be fixedly supported on a structure (e.g., the second structure 120) of the electronic device 100. The variable part 134 may extend from the fixed part 132 so as to have shape variability and may be partially deformed as the state of the electronic device 100 is changed. For example, the variable part 134 may be at least partially deformed to be flat or curved while partially rotating and linearly moving in response to an operation in which the state of the electronic device 100 is changed.

The variable part 134 may include a rolling part 136 deformed while rotating and linearly moving depending on a change of state of the electronic device 100 and an extending part 138 extending from the rolling part 136. The extending part 138 may extend from the rolling part 136 to face the fixed part 132 or the rolling part 136 depending on the states of the electronic device 100 and may remain flat. For example, the rolling part 136 may be disposed between the fixed part 132 and the extending part 138, and the extending part 138 may have a smaller size (or area) than the fixed part 132 and the rolling part 136.

However, the shape of the display 130 is not limited to the illustrated embodiment. According to various embodiments, the variable part 134 of the display 130 may not include the extending part 138 and may be entirely formed of the rolling part 136. Furthermore, according to various embodiments, in the display 130, the extending part 138 may extend from the rolling part 136 so as to have a width (e.g., a distance measured in the x-axis direction) smaller than that in the embodiment illustrated in FIGS. 3A and 3B.

The fixed part 132 may form a substantially flat surface. For example, the fixed part 132 may maintain a shape in which most of the region is formed to be flat, but one edge region is curved. The variable part 134 may be partially deformed to be flat or curved when the display 130 is slid in or out depending on a change of state of the electronic device 100. For example, the fixed part 132 may remain substantially flat in the default state (e.g., the state of FIG. 1) and the extended state (e.g., the state of FIG. 2) of the electronic device 100. In the default state, a portion of the rolling part 136 adjacent to the fixed part 132 may be curved, and the rest of the variable part 134 (e.g., the remaining portion of the rolling part 136 and the extending part 138) may be flat while facing the fixed part 132. In the extended state, a portion of the rolling part 136 adjacent to the fixed part 132 may be disposed side by side with the fixed part 132 and may be flat, and the rest of the rolling part 136 may be curved. In the default state and the extended state, the extending part 138 of the variable part 134 may remain flat while being parallel to the fixed part 132.

According to the embodiment illustrated in FIGS. 1, 2, 3A, and 3B, the fixed part 132 may form the default region (e.g., the default region 130a of FIGS. 1 and 2) together with a portion of the variable part 134. The remaining portion of the variable part 134 may form the extended region (e.g., the extended region 130b of FIG. 2). For example, a surface of the fixed part 132 and a surface of a portion of the variable part 134 may form the default region 130a. According to the illustrated embodiment, a portion of the variable part 134 may be included in the default region 130a, and the remaining portion of the variable part 134 may be included in the extended region 130b. However, the illustrated embodiment is illustrative, and according to various embodiments, in the default state, the variable part 134 of the display 130 may be hidden by the first structure (e.g., the first structure 110 of FIGS. 1 and 2) so as not to be exposed on the front surface of the electronic device 100. In this case, it may be understood that the default region 130a is formed by the fixed part 132 and the extended region 130b is formed by the variable part 134.

Referring to FIG. 4, the display 130 according to an embodiment may include a plurality of layers. For example, the display 130 may be formed in a structure in which a plurality of layers 140, 150, 160, and 170 are stacked one above another. The fixed part 132 and the variable part 134 of the display 130 described with reference to FIG. 3 may be divided from each other in the width direction of the display 130 (e.g., the x-axis direction) based on whether the shape is deformed. Both the fixed part 132 and the variable part 134 may be formed of the plurality of layers having a stacked structure. For example, one portion (or section) of each of the plurality of layers may be included in the fixed part 132 of the display 130, and another portion (or section) may be included in the variable part 134 of the display 130.

The plurality of layers included in the display 130 may include the panel layer 140, the reinforcing layer 150, the cover layer 160, a first protective layer 172, and/or a second protective layer 174. For example, the reinforcing layer 150, the cover layer 160, and the protective layer 170 may be sequentially stacked on the panel layer 140, and the protective layer 170 may form a surface of the display 130 exposed outside the electronic device 100.

However, the stacked structure of the display 130 illustrated in FIG. 4 is illustrative, and the disclosure is not limited thereto. According to various embodiments, at least one of the first protective layer 172 or the second protective layer 174 may be omitted from the display 130. Furthermore, according to various embodiments, the display 130 may further include an additional protective film (not illustrated), and the protective film may be attached so as to be removable when the electronic device 100 is used.

The panel layer 140 may display a specified screen and/or image in relation to an operation and/or function of the electronic device 100. The panel layer 140 may include a pixel layer (not illustrated) that includes a plurality of light emitting elements, an encapsulation layer (not illustrated) that seals the light emitting elements, a touch sensor layer (not illustrated) that includes touch electrodes, a wiring layer (not illustrated) that includes transistors electrically connected with the light emitting elements, and/or a polarization layer (not illustrated) that prevents reflection of external light to secure visibility. For example, the polarization layer may include a poly ethylene terephthalate (PET) film, a tri-acetyl cellulose (TAC) film, a cycle-olefin polymer (COP) film, or a poly-vinyl alcohol (PVA) film. A stacked structure of the panel layer 140 is not limited to the above-described example, and the panel layer 140 may additionally include other layers or omit one or more of the layers.

The panel layer 140 may, for example, include at least one of a liquid crystal display (LCD) panel, a light emitting diode (LED) display panel, an organic light emitting diode (OLED) display panel, a microelectromechanical systems (MEMS) display panel, a transparent display panel, or an electronic paper display panel.

The reinforcing layer 150 and the cover layer 160 may be disposed between the panel layer 140 and the protective layer 170. The reinforcing layer 150 may be disposed between the panel layer 140 and the cover layer 160, and the cover layer 160 may be disposed between the reinforcing layer 150 and the protective layer 170. The reinforcing layer 150 and the cover layer 160 may be formed of a light transmitting material capable of passing light emitted from the panel layer 140. The reinforcing layer 150 may be attached to the cover layer 160 and the panel layer 140. For example, the reinforcing layer 150 may couple the cover layer 160 and the panel layer 140. The reinforcing layer 150 may, for example, be formed of a transparent adhesive and/or a transparent resin. For example, the reinforcing layer 150 may include an optical clear resin (OCR), an optical clear adhesive (OCA), a pressure sensitive adhesive (PSA), or a photosensitive adhesive (e.g., a UV resin).

The cover layer 160 may include a first surface 160*a* (e.g., a surface facing in the −z-axis direction) that faces toward the panel layer 140 and a second surface 160*b* (e.g., a surface facing in the +z-axis direction) that faces away from the first surface 160*a*. The reinforcing layer 150 may be attached to the first surface 160*a* of the cover layer 160, and the protective layer 179 (e.g., the first protective layer 172) may be attached to the second surface 160*b* of the cover layer 160.

The cover layer 160 may, for example, be formed of glass or a polymer film. For example, the cover layer 160 may be formed of an ultra-thin glass (UTG) material, a PI material, or a PET material. The cover layer 160 may partially have different thicknesses. For example, the cover layer 160 may have different thicknesses to correspond to the fixed part 132 and the variable part 134 of the display 130. Furthermore, the cover layer 160 may be formed such that in a region corresponding to the variable part 134, an edge portion is thicker than a central portion. The specific shape of the cover layer 160 will be described below in detail with reference to FIGS. 5, 6, 7A, and 7B.

Between the cover layer 160 and the panel layer 140, the reinforcing layer 150 may compensate for a thickness difference of the cover layer 160 and may improve the strength of the display 130. The reinforcing layer 150 may have different thicknesses to correspond to the shape of the cover layer 160. For example, the reinforcing layer 150 may be formed to correspond to the thickness of the cover layer 160, and thus the reinforcing layer 150 and the cover layer 160 may form a uniform flat surface. The reinforcing layer 150 may compensate for a change in the thickness of the cover layer 160 such that an empty space (e.g., an air gap or an air layer) is not formed between the panel layer 140 and the cover layer 160. Accordingly, the visibility of the panel layer 140 may be improved and/or supplemented. The specific shape of the reinforcing layer 150 will be described below in detail together with the cover layer 160 with reference to FIGS. 8A and 8B.

The protective layer 170 may form one surface of the display 130. The protective layer 170 may be disposed on (or attached to) one surface (e.g., the second surface 160*b*) of the cover layer 160 and may protect other layers (e.g., the cover layer 160, the reinforcing layer 150, and the panel layer 140) included in the display 130 from an external impact. For example, the protective layer 170 may protect the thin cover layer 160 and may prevent or reduce scattering when the cover layer 160 is cracked. The protective layer 170 may, for example, include a glass material, or may be implemented with a film layer or a coating layer. The protective layer 170 may include a flexible material. The protective layer 170 may be formed of a transparent material having a high light transmittance.

The protective layer 170 may prevent the cover layer 160 from being contaminated by dust or oil. For example, the protective layer 170 may include an anti-smudge coating or an anti-fingerprint coating that prevents a mark, such as a fingerprint due to user contact, from being formed on a surface of the cover layer 160.

The protective layer 170 may include the first protective layer 172 and the second protective layer 174. The first protective layer 172 may be stacked on top of the cover layer 160, and the second protective layer 174 may be stacked on top of the first protective layer 172. For example, the cover layer 160 may be disposed between the first protective layer 172 and the reinforcing layer 150, and the first protective layer 172 may be disposed between the cover layer 160 and the second protective layer 174. An adhesive layer (not illustrated) may be disposed between the first protective layer 172 and the cover layer 160 and between the first protective layer 172 and the second protective layer 174. One surface of the second protective layer 174 may form a surface of the display 130 exposed outside the electronic device 100. According to various embodiments, the first protective layer 172 may be implemented with a protective film layer made of a flexible material, and the second protective layer 174 may be implemented with a hard coating layer or an anti-fingerprint coating layer. The illustrated embodiment is illustrative. The protective layer 170 may include only one of the first protective layer 172 and the second protective layer 174, and the display 130 may not include the protective layer 170.

Figure 5:
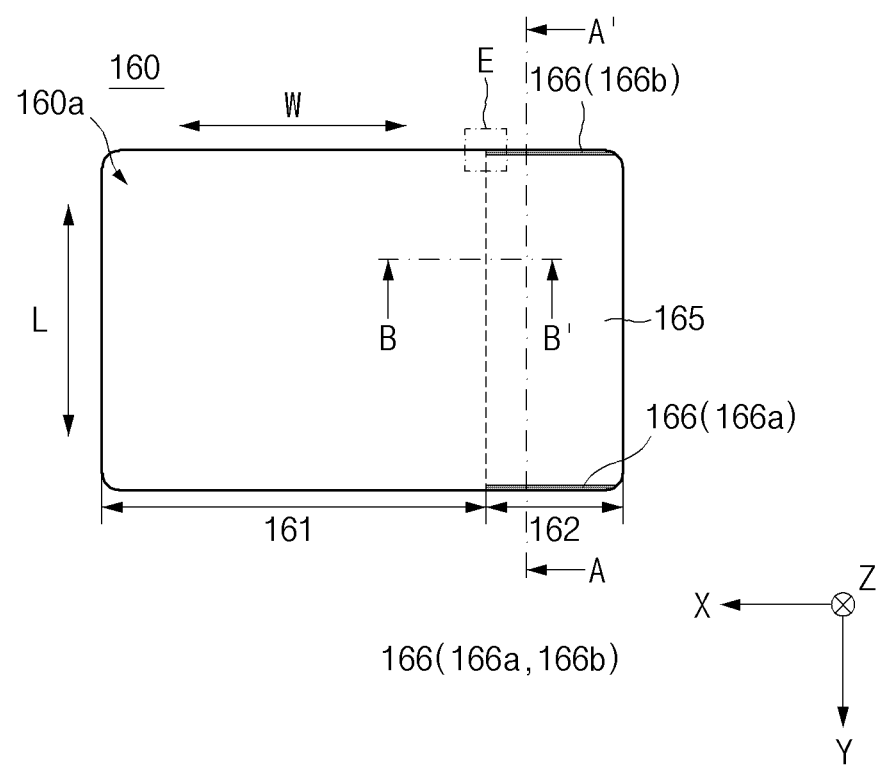
FIG. 5 is a view illustrating an example cover layer of the example display according to various embodiments.
Figure 6:
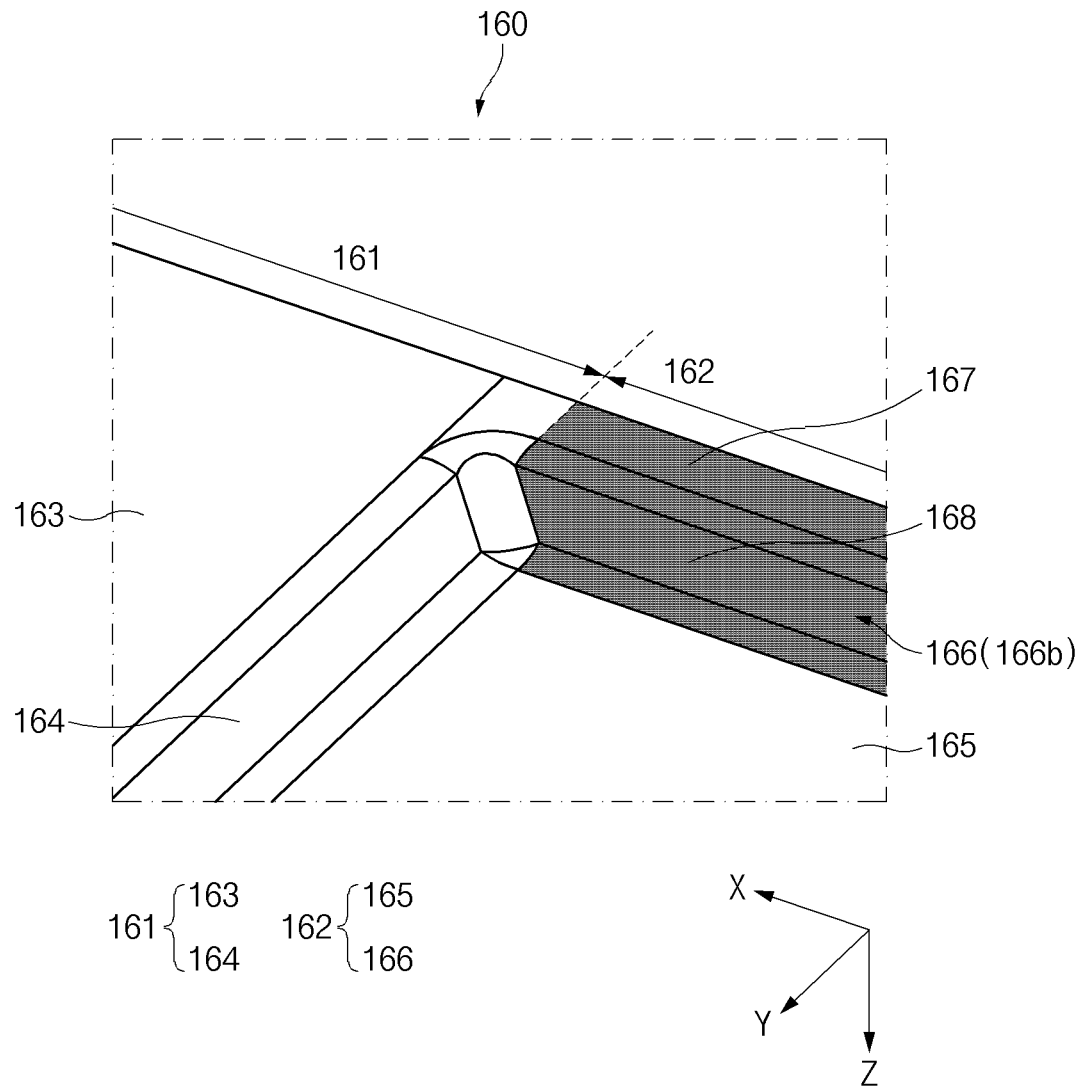
FIG. 6 is an enlarged view illustrating a portion of the example cover layer according to various embodiments.

FIG. 5 is a view illustrating an example cover layer of the display according to various embodiments. FIG. 6 is an enlarged view illustrating a portion of the cover layer according to various embodiments.

FIG. 5 is a plan view of the first surface (e.g., the first surface 160*a* of FIG. 4) of the cover layer (e.g., the cover layer 160 of FIG. 4) facing the panel layer (e.g., the panel layer 150 of FIG. 4) based on the stacked structure of the display illustrated in FIG. 4 (e.g., the display 130 of FIGS.

1 to 4). For example, FIG. 5 may be a view illustrating the shape of the cover layer 160 when the display 130 illustrated in FIG. 3 is unfolded flat.

FIG. 6 is an enlarged view of portion E of the cover layer 160 illustrated in FIG. 5.

Referring to FIGS. 5 and 6, the cover layer 160 of the display 130 according to an embodiment may be formed in a shape in which the thickness varies in a first direction (e.g., the x-axis direction) and a second direction (e.g., the y-axis direction) perpendicular to each other on a surface of the display 130. The first direction and the second direction may be defined as directions that are parallel to the width direction W and the lengthwise direction L of the cover layer 160, respectively. For example, the thickness of the cover layer 160 may vary in the width direction W and the lengthwise direction L of the cover layer 160 (or the display 130). For example, one portion and another portion of the cover layer 160 disposed in the width direction W may have different thicknesses. For example, one portion and another portion of the cover layer 160 disposed in the lengthwise direction L may have different thicknesses.

In embodiments of the disclosure, the width direction W may be a direction parallel to the sliding directions of the electronic device 100 (e.g., the sliding directions S1 and S2 of FIGS. 1 to 3), and the lengthwise direction L may be a direction that is perpendicular to the sliding directions S1 and S2, but is parallel to a surface (e.g., the first surface 160a or the second surface 160b) of the cover layer 160. A thickness may be a distance measured in a direction perpendicular to the width direction W and the lengthwise direction L. For example, the thickness of the cover layer 160 may be defined as a distance measured in a direction perpendicular to the first surface 160a (or, the second surface 160b) of the cover layer 160.

The cover layer 160 may include a first portion 161 and a second portion 162 extending from the first portion 161. When the electronic device 100 is driven, the first portion 161 may be fixedly maintained without being deformed, and the second portion 162 may be deformed. For example, when the display 130 slides as the electronic device 100 is driven, the first portion 161 may remain flat without being deformed, and the second portion 162 may be partially deformed to flat or curved.

The first portion 161 may correspond to the fixed part 132 of the display 130 that has a fixed shape, and the second portion 162 may correspond to the variable part 134 of the display 130 that has a variable shape. For example, the first portion 161 of the cover layer 160 may be a portion (or section) included in the fixed part 132 of the display 130, and the second portion 162 of the cover layer 160 may be a portion (or section) included in the variable part 134 of the display 130. When the display 130 of FIG. 3 is viewed, the first portion 161 may be understood as a portion of the entire cover layer 160 that is located in the fixed part 132 (or a portion overlapping the fixed part 132), and the second portion 162 may be understood as a portion of the entire cover layer 160 that is located in the variable part 134 (or a portion overlapping the variable part 134).

The first portion 161 may include a first base portion 163 and a first connecting portion 164 that extends from the first base portion 163 and that is connected with the second portion 162. The first connecting portion 164 may connect the first base portion 163 and the second portion 162 and may have a gradually decreasing thickness toward the second portion 162. For example, the first connecting portion 164 may obliquely connect the first base portion 163 that has a first thickness and a second base portion 165 of the second portion 162 that has a second thickness smaller than the first thickness. According to various embodiments, the first connecting portion 164 may be formed to have a specified inclination.

The second portion 162 may include the second base portion 165 and reinforcing portions 166 protruding from opposite edge portions of the second base portion 165 that face away from each other in the lengthwise direction L. The reinforcing portions 166 may include a first reinforcing portion 166a protruding from one edge portion (e.g., the +y-axis direction) of the second base portion 165 and a second reinforcing portion 166b protruding from an opposite edge portion (e.g., the −y-axis direction) of the second base portion 165. The first reinforcing portion 166a and the second reinforcing portion 166b may be formed in substantially the same shape. For example, the first reinforcing portion 166a and the second reinforcing portion 166b may be symmetrical to each other with respect to the center of the second base portion 165. Although FIG. 6 illustrates an enlarged view of one edge portion of the cover layer 160 on which the second reinforcing portion 166b is formed, an opposite edge portion of the cover layer 160 on which the first reinforcing portion 166a is formed may also be identical to the illustrated example.

The reinforcing portions 166 may extend from at least portions of a surface of the second base portion 165 (e.g., a surface 165s of FIGS. 7A and 7B) to have a specified thickness. For example, the reinforcing portions 166 may protrude from the surface 165s of the second base portion 165 in a direction substantially perpendicular to the surface 165s. The surface 165s of the second base portion 165 may be a partial region of the first surface 160a of the cover layer 160 that corresponds to the second base portion 165.

Each of the reinforcing portions 166 may include an edge portion 167 that forms an edge of the second portion 162 in the lengthwise direction L and a second connecting portion 168 that extends from the edge portion 167 and that is connected to the surface 165s of the second base portion 165. The second connecting portion 168 may connect the edge portion 167 and the surface 165s of the second base portion 165 and may have a gradually decreasing thickness from the edge portion 167 toward the surface 165s of the second base portion 165. For example, the second connecting portion 168 may obliquely connect the edge portion 167 protruding to a third thickness from a partial region of the surface 165s of the second base portion 165 and other partial regions of the surface 165s of the second base portion 165. According to various embodiments, the second connecting portion 168 may be formed to have a specified inclination.

According to various embodiments, at least part of the second portion 162 of the cover layer 160 may remain bent irrespective of the states of the electronic device 100. For example, when the state of the electronic device 100 is changed, at least a portion of the variable part 134 of the display 130 may move while remaining curved without being deformed flat in a sliding operation, and at least part of the second portion 162 corresponding thereto may remain bent. In the case of the above embodiment, the reinforcing portion 166 may not be formed on a bending maintaining portion of the second portion 162 of the cover layer 160 that remains bent. Accordingly, tensile stress applied to the bending maintaining portion may be reduced, and fatigue failure may be prevented or decreased.

One end of the reinforcing portion 166 may be connected with the first portion 161. For example, one end (e.g., an end in the +x-axis direction) of the reinforcing portion 166 that is adjacent to the boundary between the first portion 161 and the second portion 162 may be connected with the first portion 161. According to the illustrated embodiment, the reinforcing portion 166 and the first portion 161 may form substantially the same plane. For example, the edge portion 167 of the reinforcing portion 166 may be connected with the first base portion 163 while forming substantially the same plane. The sum of the second thickness of the second base portion 165 (e.g., T2 of FIGS. 7A and 7B) and the third thickness of the edge portion 167 (e.g. T3 of FIG. 7A) may be substantially the same as the first thickness of the first base portion 163 (e.g., T1 of FIG. 7B). However, the illustrated embodiment is illustrative, and according to various embodiments, the first base portion 163 may further protrude beyond the reinforcing portion 166 based on the surface of the second base portion 165 (e.g., refer to FIGS. 9, 10A, and 10B).

In the display 130 according to a embodiment of the disclosure, the cover layer 160 may have different thicknesses depending on a part (e.g., the fixed part 132) that maintains the form (or shape) irrespective of the states of the electronic device 100 and a part (e.g., the variable part 134) that is deformed based on the states of the electronic device 100. Accordingly, the flexibility of the display 130 may be improved, and resistance to sliding (or, bending) may be reduced.

In the display 130 according to an embodiment of the disclosure, the cover layer 160 may have different thicknesses in the lengthwise direction L on a portion (e.g., the second portion 162) of the cover layer 160 that corresponds to the variable part 134 that is deformed based on the state of the electronic device 100. Accordingly, the strength of a longitudinal edge portion of the display 130 may be improved, and delamination or damage due to buckling may be prevented.

Figure 7A:
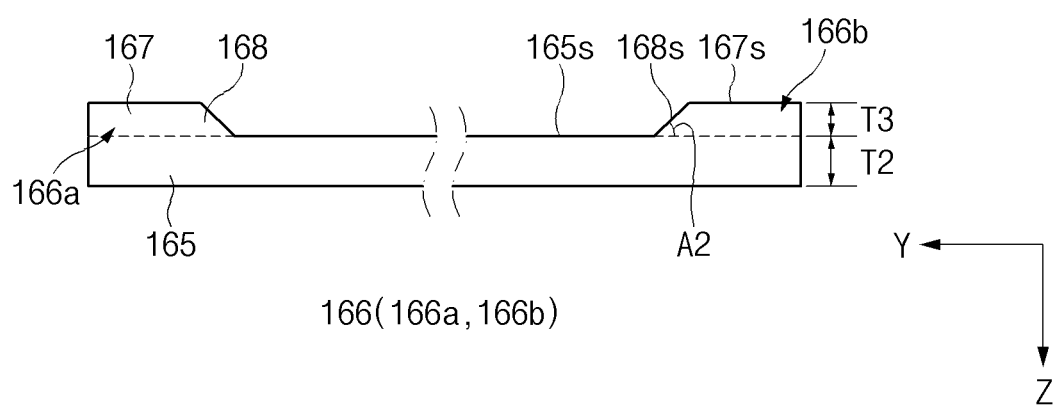
FIG. 7A is a sectional view of the example cover layer in a lengthwise direction according to various embodiments.

FIG. 7A is a sectional view of the example cover layer in the lengthwise direction according to various embodiments. FIG. 7B is a sectional view of the example cover layer in the width direction according to various embodiments.

FIG. 7A is a sectional view of the cover layer 160 taken along line A-A' in FIG. 5. FIG. 7B is a sectional view of the cover layer 160 taken along line B-B' in FIG. 5. For example, FIG. 7A may be a sectional view of the second portion 162 of the cover layer 169 in the lengthwise direction, and FIG. 7B may be a sectional view of the first portion 161 and the second portion 162 of the cover layer 160 in the width direction.

Referring to FIGS. 5, 7A, and 7B, the cover layer 160 according to an embodiment may include the first portion 161 and the second portion 162 extending from the first portion 161 in the width direction W. As illustrated in FIG. 7B, the first portion 161 may include the first base portion 163 and the first connecting portion 164 disposed between the first base portion 163 and the second portion 162 (e.g., the second base portion 165). As illustrated in FIG. 7A, the second portion 162 may include the second base portion 165 and the reinforcing portions 166 protruding (or extending) to a predetermined thickness from the second base portion 165 in a direction substantially perpendicular to the surface 165s. The reinforcing portions 166 may include the first reinforcing portion 166a and the second reinforcing portion 166b that are formed on the opposite sides of the second base portion 165 in the lengthwise direction (e.g., the y-axis direction).

The first base portion 163 of the first portion 161 may have the first thickness T1. The second base portion 165 of the second portion 162 may have the second thickness T2. The first connecting portion 164 of the first portion 161 may be disposed between the first base portion 163 and the second base portion 165. The first connecting portion 164 may have a variable thickness portion between the first base portion 163 and the second base portion 165, and the thickness of the first connecting portion 164 may gradually decrease from the first thickness T1 to the second thickness T2 with an approach to the boundary between the first connecting portion 164 and the second base portion 165 from the boundary between the first connecting portion 164 and the first base portion 163. The first connecting portion 164 may include a first inclined surface 164s that obliquely connects a surface (e.g., a surface facing in the −z-axis direction) of the first base portion 163 and a surface (e.g., a surface facing in the −z-axis direction) of the second base portion 165. The first inclined surface 164s may have a first inclination angle A1.

The reinforcing portions 166 of the second portion 162 may have the third thickness T3. For example, the edge portion 167 of each of the reinforcing portions 166 may protrude or extend from the surface 165s of the second base portion 165 by the third thickness t3 in a direction substantially perpendicular to the surface 165s, and the second connecting portion 168 may have a gradually decreasing thickness from the edge portion 167 toward the surface 165s of the second base portion 165. For example, the second connecting portion 168 may include a second inclined surface 168s that obliquely connects a surface 167s of the edge portion 167 and the surface 165s of the second base portion 165. The second inclined surface 168s may have a second inclination angle A2. In the illustrated embodiment, the second inclined surface 168s may be formed to be flat. However, this is illustrative, and, according to various embodiments, the second inclined surface 168s may be formed to be curved (e.g., refer to FIGS. 15A and 15B).

According to the embodiment of FIGS. 5, 7A and 7B, the surface 167s of the edge portion 167 and a surface 163s of the first base portion 163 may form substantially the same plane. For example, the first thickness T1 of the first base portion 163 may be substantially the same as the sum of the second thickness T2 of the second base portion 165 and the third thickness T3 of the reinforcing portion 166 (e.g., the edge portion 167).

The cover layer 160 according to an embodiment of the disclosure may include the reinforcing portion 166 formed thereon and thus may improve the strength and reduce delamination of the edge portion of the display 130. The effect of improving buckling resistance and preventing (or reducing) delamination depending on an increase in the thickness of the reinforcing portion 166 may be shown in Table 1 below.

TABLE 1

| | Thickness Ratio of Reinforcing Portion | | | | | |
|---|---|---|---|---|---|---|
| | Existing | 10% | 20% | 30% | 40% | 50% |
| Buckling Critical Load | 100% | 133% | 173% | 220% | 274% | 338% |
| Amount of Bending | 100% | 97% | 94% | 92% | 89% | 86% |

Table 1 above shows results obtained by measuring buckling critical load and bending amount when the thickness of the reinforcing portion 166 (e.g., the edge portion 167) is increased. For example, the thickness ratio of the reinforcing portion is the ratio of the third thickness T3 of the edge portion 167 to the second thickness T2 of the second base portion 165. The existing ratio means that the reinforcing portion 166 is not formed. 10% means that the ratio of the third thickness T3 to the second thickness T2 is 10%, and 50% means that the third thickness T3 is half of the second thickness T2. Referring to Table 1 above, it can be seen that when the thickness of the reinforcing portion 166 is increased, the buckling critical load for compressive load is increased and thus the buckling resistance is improved. In addition, referring to Table 1 above, it can be seen that when the same compressive load is applied, the amount of bending is reduced as the thickness of the reinforcing portion 166 is increased and thus the effect of preventing delamination and damage is improved.

The first inclined surface 164a of the first connecting portion 164 and the second inclined surface 168s of the second connecting portion 168 may have different inclinations. The first inclination angle A1 of the first inclined surface 164s and the second inclination angle A2 of the second inclined surface 168s may differ from each other. For example, the first inclination angle A1 may be smaller than the second inclination angle A2. However, this is illustrative, and, according to various embodiments, the first inclination angle A1 and the second inclination angle A2 may be equal to each other.

The first inclination angle A1 of the first inclined surface 164s of the first connecting portion 164 may be determined in consideration of visibility, and the second inclination angle A2 of the second inclined surface 168s of the second connecting portion 168 may be determined in consideration of a repulsive force in a sliding operation. For example, if the first inclination angle A1 is too large, the inclined shape of the first inclined surface 164s may be visible when the display 130 is viewed. The second inclination angle A2 may be hidden by a printed layer that is formed on the periphery of the protective layer (e.g., the protective layer 170 of FIG. 4) as an edge portion of the display 130, and thus the upper limit value considering visibility may be greater than the first inclination angle A1. If the second inclination angle A2 is too small, the sliding (or, bending or folding) performance of the display 130 may be deteriorated due to an increase in a repulsive force and/or driving resistance. Equations for determining or calculating the first inclination angle A1 and the second inclination angle A2 will be described below in detail with reference to FIGS. 8A and 8B.

Figure 8A:
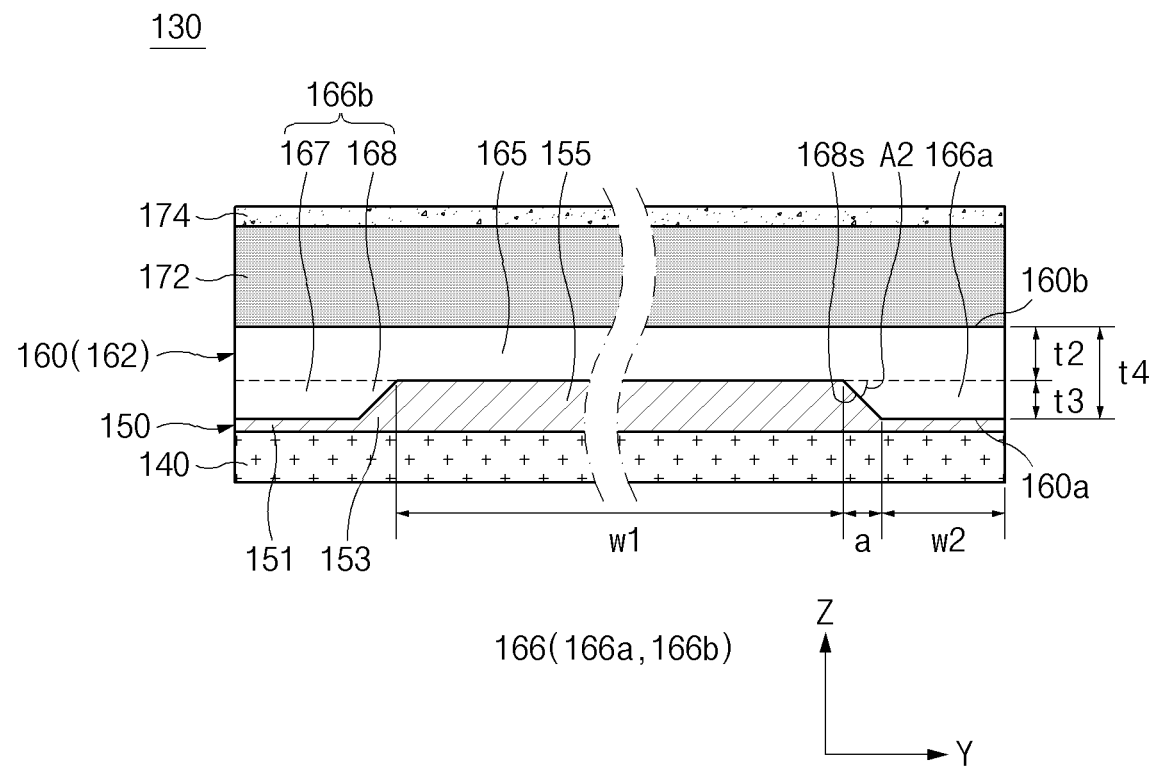
FIG. 8A is a sectional view of the example display in the lengthwise direction according to various embodiments.
Figure 8B:
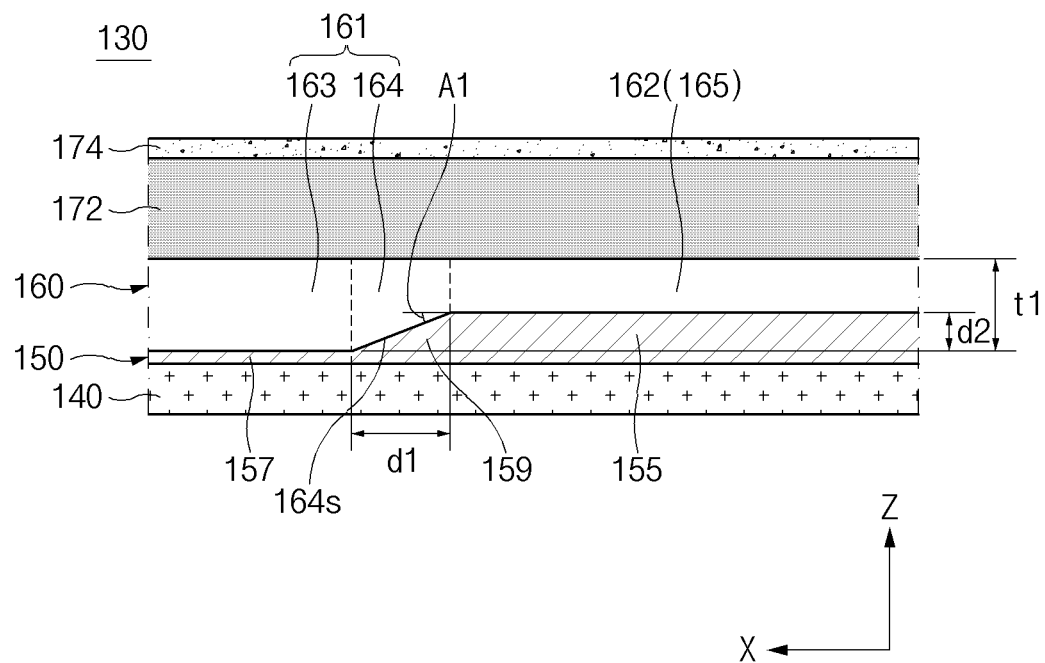
FIG. 8B is a sectional view of the example display in the width direction according to various embodiments.

FIG. 8A is a sectional view of the example display in the lengthwise direction according to various embodiments. FIG. 8B is a sectional view of the example display in the width direction according to various embodiments.

FIG. 8A is a view in which the reinforcing layer 150, the panel layer 140, and the protective layer 170 are additionally disposed under and on the cover layer 160 in the sectional view of the cover layer 160 of FIG. 7A in the lengthwise direction L.

FIG. 8B is a view in which the reinforcing layer 150, the panel layer 140, and the protective layer 170 are additionally disposed under and on the cover layer 160 in the sectional view of the cover layer 160 of FIG. 7B in the width direction W.

Referring to FIGS. 8A and 8B, the display 130 according to an example embodiment may be formed in a structure in which a plurality of layers are stacked one above another, and the plurality of layers may include the panel layer 140, the reinforcing layer 150, the cover layer 160, the first protective layer 172, and the second protective layer 174. The reinforcing layer 150 and the panel layer 140 may be attached to the first surface 160a (e.g., the surface facing in the −z-axis direction) of the cover layer 160, and the protective layer 170 may be attached to the second surface 160b (e.g., the surface facing in the +z-axis direction) of the cover layer 160.

Among the plurality of layers, the panel layer 140, the reinforcing layer 150, and the protective layer 170 may be substantially the same as the panel layer (e.g., the panel layer 140 of FIG. 4), the reinforcing layer (e.g., the reinforcing layer 150 of FIG. 4), and the protective layer (e.g., the protective layer 170 of FIG. 4) described above with reference to FIG. 4. Hereinafter, the above descriptions will not be repeated.

The reinforcing layer 150 may be disposed between the cover layer 160 and the panel layer 140, and the opposite surfaces of the reinforcing layer 150 may be attached to the cover layer 160 and the panel layer 140. The reinforcing layer 150 may be formed in a shape corresponding to a change in the thickness of the cover layer 160 to fill the space between the cover layer 160 and the panel layer 140. For example, the reinforcing layer 150 may be coupled with the cover layer 160 and may form one layer disposed between the protective layer 170 and the panel layer 140 to have a uniform thickness. The reinforcing layer 150 may compensate for the thickness difference of the cover layer 160, and thus an air layer (e.g., an air gap) may not be formed between the cover layer 160 and the panel layer 140 when the cover layer 160 is coupled (or attached) to the panel layer 140.

As illustrated in FIG. 8A, the reinforcing layer 150 may include a first thickness compensating portion 151 corresponding to the edge portion 167 of the reinforcing portion 166, a second thickness compensating portion 153 corresponding to the second connecting portion 168 of the reinforcing portion 166, and a third thickness compensating portion 155 corresponding to the second base portion 165 of the second portion 162. The second thickness compensating portion 153 may have a gradually increasing thickness from the first thickness compensating portion 151 toward the third thickness compensating portion 155. The second thickness compensating portion 153 may be formed in an inclined shape to correspond to the second inclined surface 168s of the second connecting portion 168. In various embodiments, the second thickness compensating portion 153 may be changed to correspond to the shape of the second connecting portion 168.

As illustrated in FIG. 8B, the reinforcing layer 150 may include a fourth thickness compensating portion 157 corresponding to the first base portion 163 of the first portion 161 of the cover layer 160, a fifth thickness compensating portion 159 corresponding to the first connecting portion 164 of the first portion 161, and the third thickness compensating portion 155 corresponding to the second base portion 165 of the second portion 162. The fifth thickness compensating portion 159 may have a gradually increasing thickness from the fourth thickness compensating portion 157 toward the third thickness compensating portion 155. The fifth thickness compensating portion 159 may be formed in an inclined shape to correspond to the first inclined surface 164s of the first connecting portion 164. In various embodiments, the fifth thickness compensating portion 159 may be changed to correspond to the shape of the first connecting portion 164.

According to the embodiment illustrated in FIG. 8B, the first connecting portion 164 may include the first inclined surface 164s, and the first inclination angle A1 of the first inclined surface 164s may be determined based on Equation 1 below.

$$O/A = \tan\left[\tan^{-1}\frac{d2}{d1} - \sin^{-1}\left\{\frac{n_1}{n_2}\sin\left(\tan^{-1}\frac{d2}{d1}\right)\right\}\right] \cdot t_1 \quad \text{[Equation 1]}$$

In Equation 1 above, O/A is the width of a distortion region, d1 is the width of the first inclined surface 164s, d2 is the height of the first inclined surface 164s, n1 is the refractive index of the cover layer 160, n2 is the refractive index of the reinforcing layer 150, and t1 is the maximum thickness of the cover layer 160 (e.g., the thickness of the first base portion 163). The first inclination angle A1 of the first inclined surface 164s may be defined as $$\tan^{-1}\frac{d2}{d1}.$$

For example, based on Equation 1, the first inclination angle A1 may be determined based on the width of the distortion region in which the first inclined surface 164s is not visible to the naked eyes.

In various embodiments, the first inclined surface 164s may not be visible to the naked eyes when the distortion region has a width of about 0.13 mm or less, and the first inclination angle A1 may be calculated based on Equation 1 based on the range. According to various embodiments, the first inclination angle A1 may range from about 1° to about 10°, but is not limited thereto.

According to the embodiment illustrated in FIG. 8A, the second connecting portion 168 may include the second inclined surface 168s, and the second inclination angle A2 of the second inclined surface 168s may be determined based on Equation 2 and Equation 3 below.

$$F \propto \frac{\sigma^2 I}{E \cdot t_4} \propto \frac{EI_{edge}}{(R - t_f)} \quad \text{[Equation 2]}$$

$$I_{Edge} = \frac{w_1 t_2^3 + 2w_2 t_4^3}{12} + \frac{at_2^3}{3} + \frac{a(t_3)(t_4^2 + 2t_2 t_4 + 3t_2^2)}{12} \quad \text{[Equation 3]}$$

In Equation 2 above, F represents a repulsive force, E represents the Young's modulus of a material (e.g., glass) of which the cover layer 160 is formed, $I_{edge}$ represents the second moment of inertia of the second portion 162 (e.g., a bending portion), R represents the bending radius of the second portion 162, and $t_f$ represents the thickness of the variable part 134 of the display 130.

In Equation 3 above, w1 is the distance (e.g., the length in the y-axis direction) between the reinforcing portions 166, w2 is the width of the edge portion 167 of the reinforcing portion 166, a is the width of the second connecting portion 168 of the reinforcing portion 166, t2 is the thickness of the second base portion 165, t3 is the thickness of the reinforcing portion 166, and t4 represents the sum of the thicknesses of the second base portion 165 and the reinforcing portion 166. For example, a may be the width of the second inclined surface 168s, and t3 may be the height of the second inclined surface 168s.

The second inclination angle A2 of the second inclined surface 168s may be defined as $$\tan^{-1}\frac{t_3}{a}$$

and may be determined based on Equation 2 and Equation 3 above. According to various embodiments, the second inclination angle A2 may range from about 0.01° to about 0.6°, but is not limited thereto.

In an embodiment in which the first base portion 163 of the first portion 161 and the edge portion 167 of the reinforcing portion 166 are formed at the same height, the sum of the thicknesses of the second base portion 165 and the reinforcing portion 166 may be substantially the same as the thickness of the first base portion 163, and t4 may be equal to t1 of Equation 1.

Figure 9A:
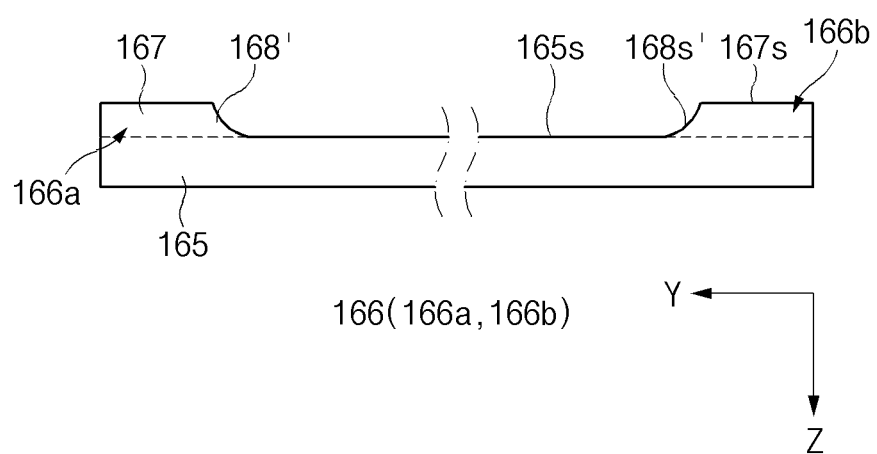
FIG. 9A is a sectional view of a second portion of an example cover layer in a lengthwise direction according to various embodiments.
Figure 9B:
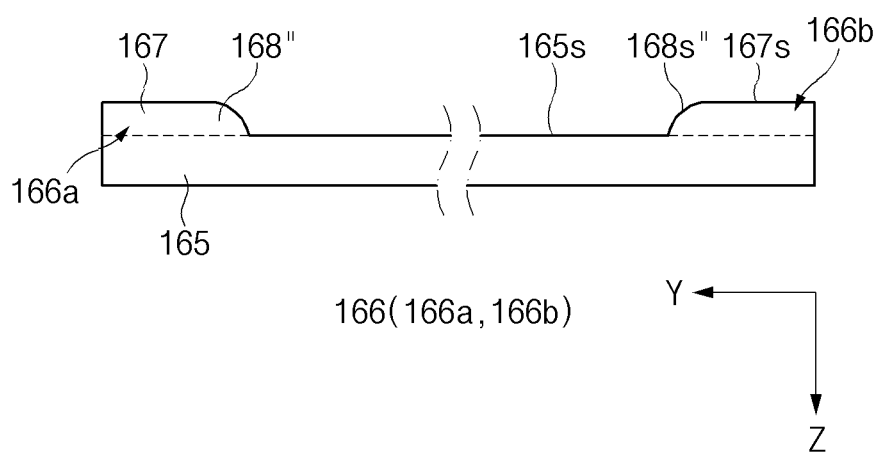
FIG. 9B is a sectional view of a second portion of an example cover layer in a lengthwise direction according to various embodiments.

FIG. 9A is a sectional view of a second portion of an example cover layer in a lengthwise direction according to various embodiments. FIG. 9B is a sectional view of a second portion of an example cover layer in a lengthwise direction according to various embodiments.

FIGS. 9A and 9B are views illustrating cover layers 160' and 160" according to example embodiments in which in the cover layer described with reference to the previous drawings (e.g., the cover layer 160 of FIGS. 6 and 7A), the second inclined surface (e.g., the second inclined surface 168s of FIGS. 6 and 7A) of the second connecting portion (e.g., the second connecting portion 168 of FIGS. 6 and 7A) is changed to a curved surface rather than a flat surface. Referring to FIGS. 9A and 9B, the second portions 162' and 162" of the cover layers 160' and 160" according to example embodiments may include a second base portion 165 and a reinforcing portion 166 protruding from the second base portion 165. The reinforcing portion 166 may include an edge portion 167 having a constant thickness and a second connecting portion 168' or 168" extending from the edge portion 167 and having a gradually decreasing thickness. The descriptions about the structure and configuration of the cover layer 160 described above with reference to the previous drawings may be identically applied to the cover layers 160' and 160" illustrated in FIGS. 9A and 9B.

Unlike the cover layer 160 illustrated in FIG. 7A, the second connecting portions 168' and 168" of the cover layers 160' and 160" illustrated in FIGS. 9A and 9B may include a concave surface 168s' or a convex surface 168s" rather than an inclined flat surface (e.g., the second inclined surface 168s of FIG. 7A).

Referring to FIG. 9A, the cover layer 160' may be formed such that the second connecting portion 168' of the reinforcing portion 166 has an inclined structure including the concave surface 168s'. For example, the concave surface 168s' may be a curved surface formed to be concave in a direction (e.g., the +z-axis direction) toward a surface 165s of the second base portion 165. Since the second connecting portion 168' has a gradually decreasing thickness, the concave surface 168' may be formed to connect a surface 167s of the edge portion 167 and the surface 165s of the second base portion 165.

When the second connecting portion 168' is formed in a form including the concave surface 168s' as illustrated in FIG. 9A, the total volume of the reinforcing portion 166 (e.g., the volume or size of the second connecting portion 168') may be reduced, and thus a repulsive force and/or driving resistance may be additionally decreased.

Referring to FIG. 9B, the cover layer 160" may be formed such that the second connecting portion 168" of the reinforcing portion 166 has an inclined structure including the convex surface 168s". For example, the convex surface 168s" may be a curved surface formed to be convex in a direction (e.g., the −z-axis direction) in which a surface 165s of the second base portion 165 faces. Since the second connecting portion 168" has a gradually decreasing thickness, the convex surface 168s" may be formed to connect a surface 167s of the edge portion 167 and the surface 165s of the second base portion 165.

When the second connecting portion 168" is formed in a form including the convex surface 168s" as illustrated in FIG. 9B, the thickness variation structure of the second connecting portion 168" may be less visible to the naked eye, and thus visibility may be improved.

Figure 10:
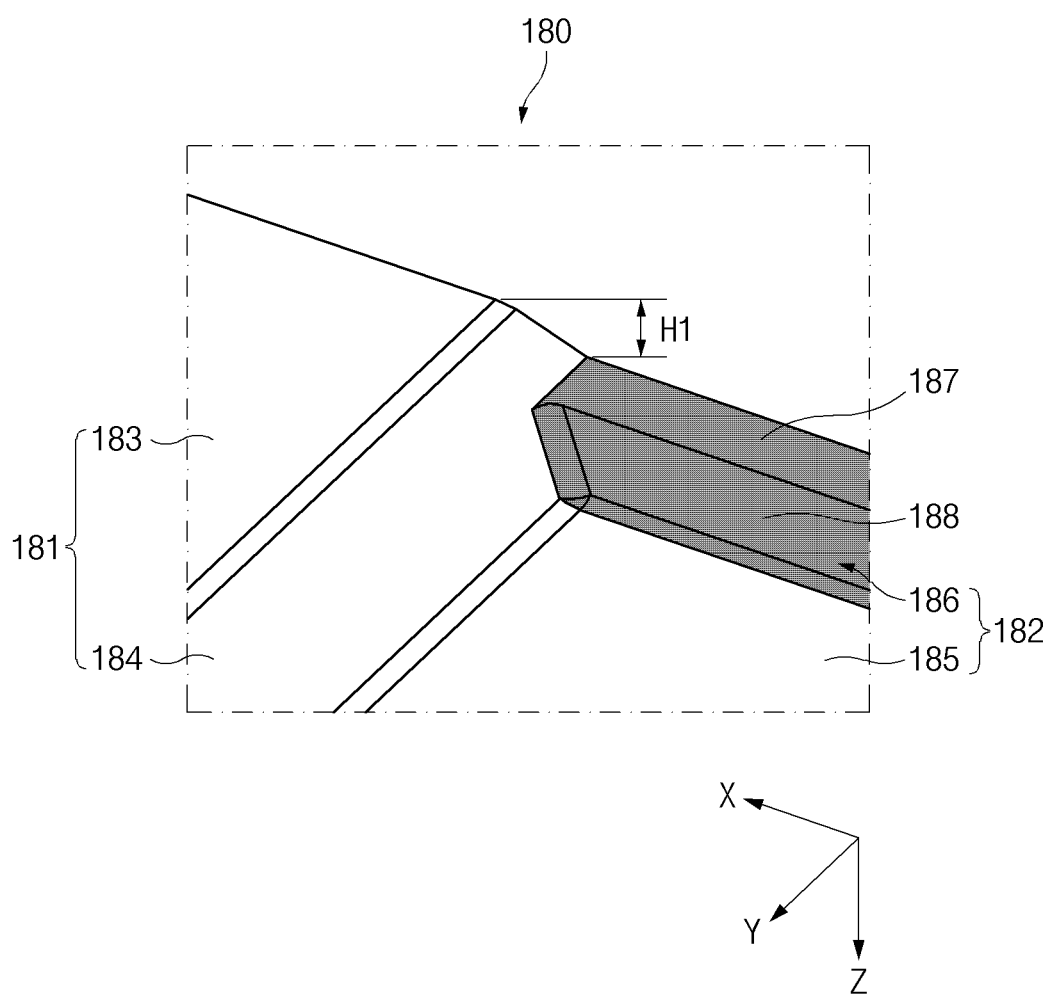
FIG. 10 is an enlarged view illustrating a portion of an example cover layer according to various embodiments.
Figure 11A:
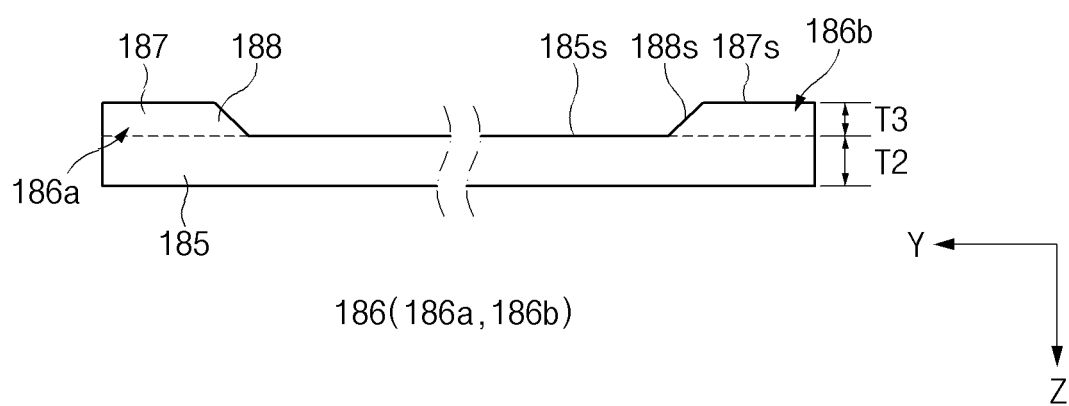
FIG. 11A is a sectional view of the example cover layer in a lengthwise direction according to various embodiments.
Figure 11B:
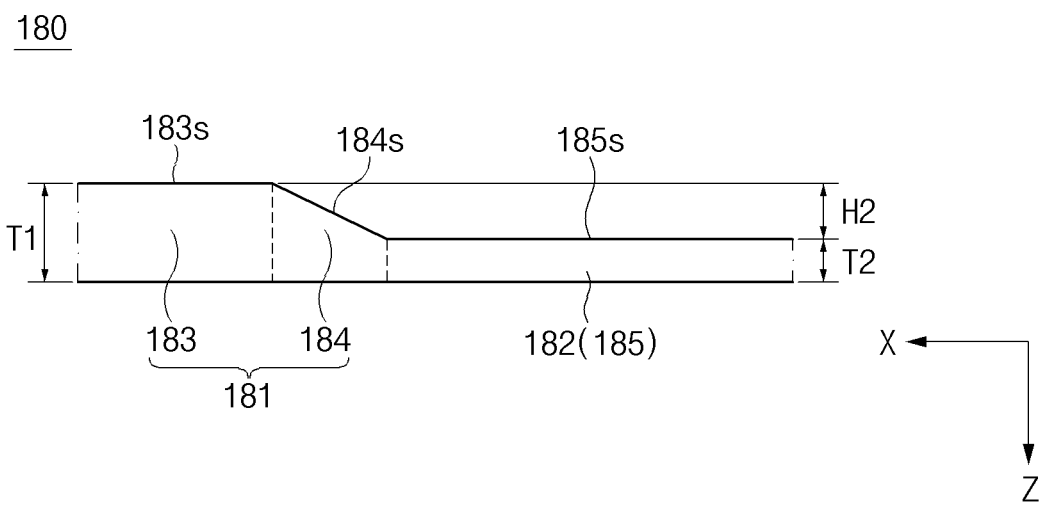
FIG. 11B is a sectional view of the example cover layer in a width direction according to various embodiments.

FIG. 10 is an enlarged view illustrating a portion of an example cover layer according to various embodiments. FIG. 11A is a sectional view of the example cover layer in a lengthwise direction according to various embodiments. FIG. 11B is a sectional view of the example cover layer in a width direction according to various embodiments.

FIGS. 10, 11A, and 11B are views illustrating a cover layer 180 of a second embodiment in which in the cover layer 160 of the first embodiment described above with reference to FIGS. 6, 7A, and 7B, the thickness of the first base portion 163 of the first portion 161 is greater than the sum of the thicknesses of the reinforcing portion 166 and the second base portion 165.

Referring to FIGS. 10, 11A, and 11B, the cover layer 180 according to an embodiment may include a first portion 181 and a second portion 182. The first portion 181 may include a first base portion 183 and a first connecting portion 184, and the second portion 182 may include a second base portion 185 and a reinforcing portion 186. The reinforcing portion 186 may include an edge portion 187 and a second connecting portion 188. For example, a first reinforcing portion 186a and a second reinforcing portion 186b may be formed on opposite sides of the second base portion 185 in the lengthwise direction (e.g., the y-axis direction). Each of the first reinforcing portion 186a and the second reinforcing portion 186b may include the edge portion 187 and the second connecting portion 188.

The description of the cover layer according to the first embodiment (e.g., the cover layer 160 of FIGS. 6, 7A, and 7B) may be identically applied to the cover layer 180 according to the second embodiment. Components included in the cover layer 180 according to the second embodiment may be substantially the same as, or similar to, the components (e.g., the first portion 161 and the second portion 162 of FIGS. 6, 7A, and 7B) included in the cover layer 160 according to the first embodiment. For example, the first base portion 183, the first connecting portion 184, the second base portion 185, the reinforcing portion 186, the edge portion 187, and the second connecting portion 188 of the cover layer 180 according to the second embodiment may correspond to as the first base portion 163, the first connecting portion 164, the second base portion 165, the reinforcing portion 166, the edge portion 167, and the second connecting portion 168 of the cover layer 160 illustrated in FIGS. 6, 7A, and 7B. Hereinafter, repetitive descriptions will be omitted, and the following description will be focused on changed portions.

The cover layer 180 may be formed such that the first base portion 183 of the first portion 181 further protrudes beyond the reinforcing portion 186 from the second base portion 185 (e.g., a surface 185s of the second base portion 185). For example, the first base portion 183 may be located in a higher position than the edge portion 187 of the reinforcing portion 186 by a predetermined height H1 based on the second base 185. Due to the height difference H1, one end of the reinforcing portion 186 that is adjacent to the boundary between the first portion 181 and the second portion 182 may be connected with the first connecting portion 184 of the first portion 181. Unlike in the cover layer 160 of the first embodiment, a surface 187s of the edge portion 187 and a surface 183s of the first base portion 183 may be connected with a step in the cover layer 180 of the second embodiment.

The first base portion 183 of the first portion 181 may have a first thickness T1. The second base portion 185 of the second portion 182 may have a second thickness T2. The edge portion 187 of the reinforcing portions 166 may have a third thickness T3. The first connecting portion 184 may obliquely connect the first base portion 183 and the second base portion 185, and the second connecting portion 188 may obliquely connect the edge portion 187 and the second base portion 185.

The first thickness T1 of the first base portion 183 may be greater than the sum of the second thickness T2 of the second base portion 185 and the third thickness T3 of the edge portion 187 (e.g., T1>T2+T3). For example, the surface 187s of the edge portion 187 may be located at the same height as the third thickness T3 based on the surface 185s of the second base portion 185, the surface 183s of the first base portion 183 may be located at a height (H2=T1−T2) corresponding to the difference between the first thickness T1 and the second thickness T2 based on the surface 185s of the second base portion 185, and the height H2 of the first base portion 183 may be greater than the height (e.g., the third thickness T3) of the edge portion 187 (e.g., T1−T2>T3).

By increasing the thickness of the first base portion 183 of the first portion 181, the cover layer 180 according to the second embodiment may improve the strength of the first portion 181 corresponding to the fixed part of the display 130 (e.g., the fixed part 132 of FIG. 3). The first portion 181 may be a portion included in the fixed part 132 of the display 130, the shape of which is fixed without being deformed when the electronic device 100 is driven. The first portion 181 may not increase the driving resistance of the display 130 even though the thickness is increased.

Figure 12:
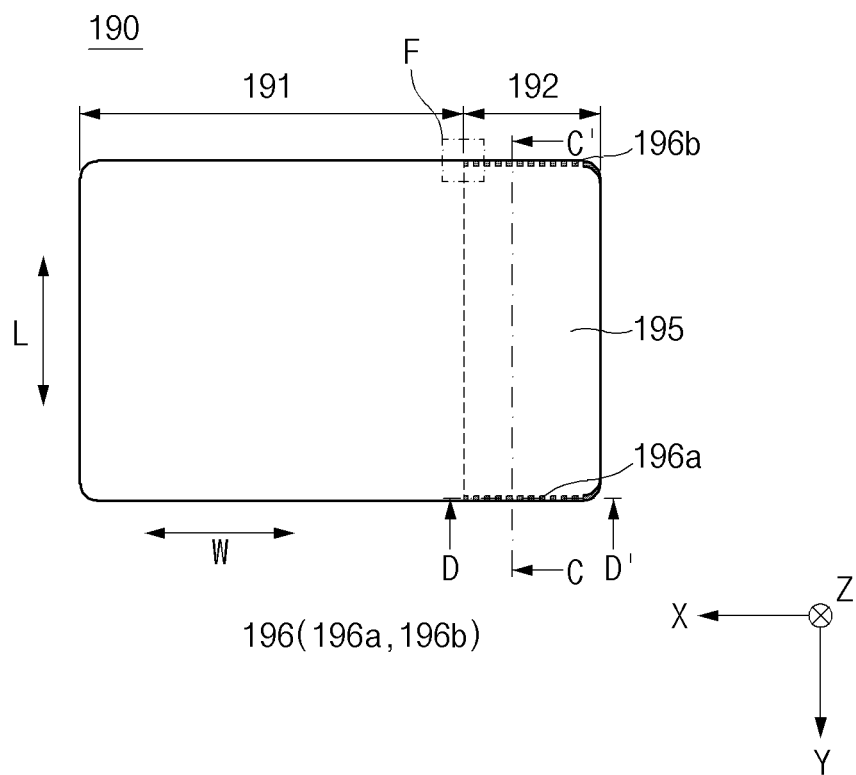
FIG. 12 is a view illustrating an example cover layer of the display according to an embodiment.
Figure 13:
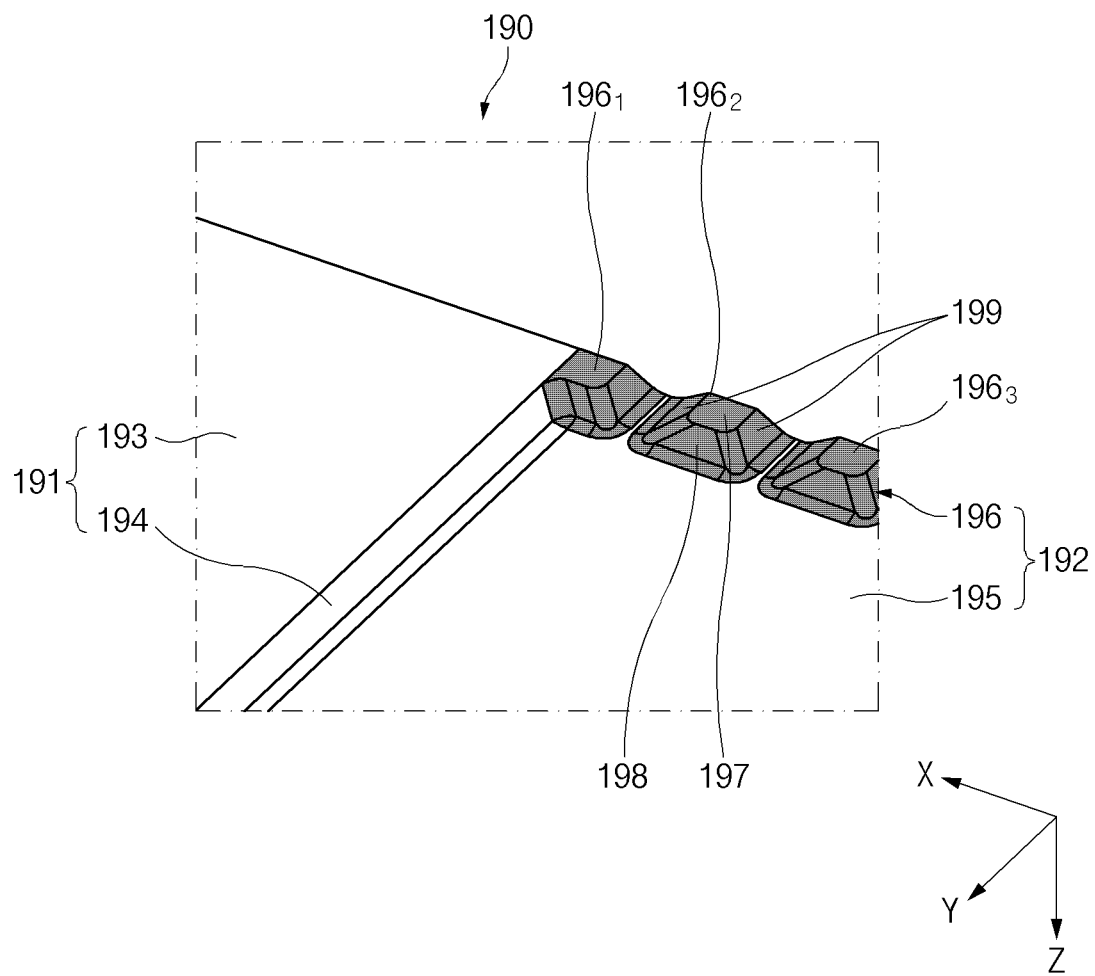
FIG. 13 is an enlarged view illustrating a portion of the example cover layer according to various embodiments.
Figure 14A:
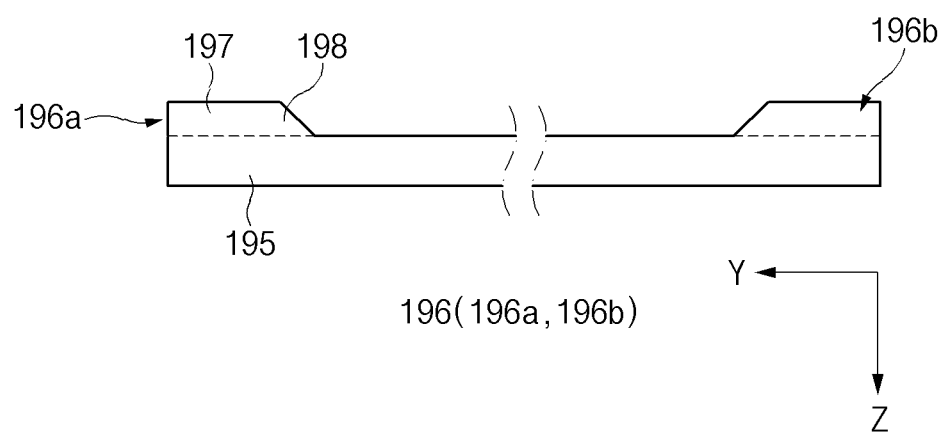
FIG. 14A is a sectional view of a second portion of the example cover layer in a lengthwise direction according to various embodiments.
Figure 14B:
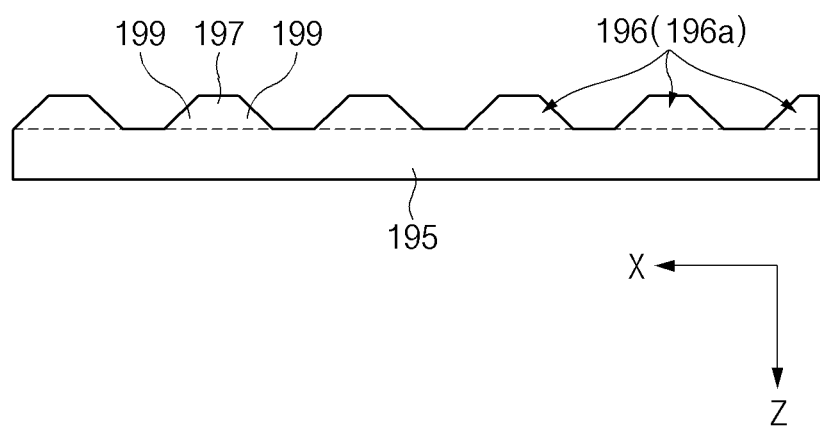
FIG. 14B is a sectional view of the second portion of the example cover layer in a width direction according to various embodiments.

FIG. 12 is a view illustrating an example cover layer of the display according to various embodiments. FIG. 13 is an enlarged view illustrating a portion of the example cover layer according to various embodiments. FIG. 14A is a sectional view of a second portion of the example cover layer in a lengthwise direction according to various embodiments. FIG. 14B is a sectional view of the second portion of the example cover layer in a width direction according to various embodiments.

FIG. 13 is an enlarged view of portion F of the cover layer 190 illustrated in FIG. 12.

FIG. 14A is a sectional view of the example cover layer 190 taken along line C-C' in FIG. 12. FIG. 14B is a sectional view of the example cover layer 190 taken along line D-D' in FIG. 12. For example, FIG. 14B may be a sectional view of the second portion 192, on which reinforcing portions 196 are formed, in the width direction.

FIGS. 12, 13, 14A, and 14B are views illustrating the example cover layer 190 according to a third embodiment in which one reinforcing portion (e.g., the reinforcing portion 166 of FIGS. 6 and 7A or the reinforcing portion 186 of FIGS. 10 and 11A) is not continuously connected and the plurality of reinforcing portions 196 are spaced apart from each other, unlike in the cover layers according to the first embodiment and the second embodiment described with reference to the previous drawings (e.g., the cover layer 160 of FIGS. 6 and 7A and the cover layer 180 of FIGS. 10 and 11A).

Referring to FIGS. 12, 13, 14A, and 14B, the cover layer 190 according to an embodiment may include a first portion 191 and a second portion 192. The first portion 191 may include a first base portion 193 and a first connecting portion 194, and the second portion 192 may include a second base portion 195 and the plurality of reinforcing portions 196. For example, a first plurality of reinforcing portions 196a and a second plurality of reinforcing portions 196b may be formed on opposite sides of the second base portion 195 in the lengthwise direction L (e.g., the y-axis direction). The first plurality of reinforcing portions 196a and the second plurality of reinforcing portions 196b may be formed in substantially the same shape.

The descriptions about the structure and configuration of the cover layer 160 described above with reference to the previous drawings may be applied to the cover layer 190 illustrated in FIGS. 12, 13, 14A, and 14B. For example, the first base portion 193, the first connecting portion 194, the second base portion 195, the reinforcing portions 196, an edge portion 197, and second connecting portions 198 and 199 of the cover layer 190 according to the third embodiment may correspond to the first base portion 163, the first connecting portion 164, the second base portion 165, the reinforcing portion 166, the edge portion 167, and the second connecting portion 168 of the cover layer 160 illustrated in FIGS. 6, 7A, and 7B. Hereinafter, repetitive descriptions will be omitted, and the following description will be focused on changed portions.

The plurality of reinforcing portions 196 may protrude from the second base portion 195 of the second portion 192 and may be spaced apart from each other by a specified gap in the width direction W (e.g., the x-axis direction). For example, the plurality of reinforcing portions 196 may be provided in a form in which protrusions are arranged in the width direction W on an edge portion of the second base portion 195 in the lengthwise direction L (e.g., the y-axis direction). For example, based on FIG. 13, the plurality of reinforcing portions 196 may include a first protrusion $196_1$, a second protrusion $196_2$ spaced apart from the first protrusion $196_1$ in the width direction W, and a third protrusion $196_3$ spaced apart from the second protrusion $196_2$ in the width direction W.

According to various embodiments, the plurality of reinforcing portions 196 including the protrusions spaced apart from each other may be understood as an integrally extending reinforcing portion having cut-away portions formed thereon.

The cover layer 190 may include the plurality of reinforcing portions 196 spaced apart from each other. Accordingly, the total volume of the reinforcing portions 196 may be reduced. Thus, the strength of an edge portion of the display 130 may be improved, and a repulsive force and/or driving resistance may be decreased.

Each of the plurality of reinforcing portions 196 may include an edge portion 197 protruding to a specified thickness from the second base portion 195 and a plurality of second connecting portions 198 and 199 obliquely extending from the edge portion 197 toward the second base portion 195. For example, the plurality of second connecting portions 198 and 199 may include the first sub-connecting portion 198 that connects the edge portion 197 and the second base portion 195 in the lengthwise direction L and the second sub-connecting portion 199 that extends in the width direction W so as to be disposed between the plurality of reinforcing portions 196 adjacent to each other. The first sub-connecting portion 198 and the second sub-connecting portion 199 may have substantially the same inclination angle. However, this is illustrative, and, according to various embodiments, first sub-connecting portion 198 and the second sub-connecting portion 199 may have different inclination angles.

Figure 15:
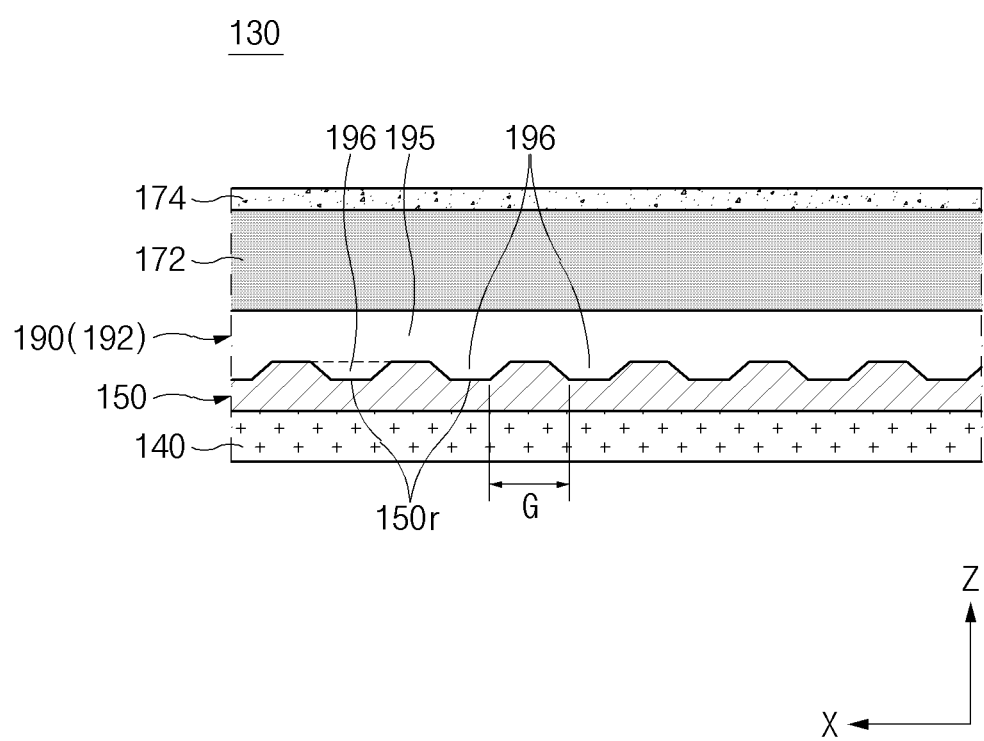
FIG. 15 is a sectional view of the example display in a width direction according to various embodiments.

FIG. 15 is a sectional view of the display in the width direction according to various embodiments.

FIG. 15 is a view in which the reinforcing layer 150, the panel layer 140, and the protective layer 170 are additionally disposed under and on the cover layer 190 in the sectional view of the cover layer 190 of FIG. 14B in the width direction W.

Referring to FIG. 15, the display 130 according to an embodiment may be formed in a structure in which a plurality of layers are stacked one above another, and the plurality of layers may include the panel layer 140, the reinforcing layer 150, the cover layer 190, the first protective layer 172, and the second protective layer 174. For example, the plurality of layers of FIG. 15 may correspond to the plurality of layers of FIG. 4 (e.g., the panel layer 140, the reinforcing layer 150, the cover layer 160, the first protective layer 172, and the second protective layer 174 of FIG. 4), respectively.

The reinforcing layer 150 may be disposed between the cover layer 190 and the panel layer 140 and may be formed in a shape corresponding to a change in the thickness of the cover layer 190 to fill the space between the cover layer 190 and the panel layer 140. The reinforcing layer 150 may include a plurality of depressions 150r corresponding to the plurality of reinforcing portions 196 of the cover layer 190.

The plurality of reinforcing portions 196 may be spaced apart from each other by a specified gap G. The gap G between the plurality of reinforcing portions 196 may be determined in consideration of improvement of buckling resistance and filling of the reinforcing layer 150. For example, if the gap G between the plurality of reinforcing portions 196 is too narrow, the reinforcing layer 150 may not sufficiently fill between the reinforcing portions 196 adjacent to each other, and therefore bubbles may be generated. Accordingly, the bubbles may be visible on the display 130, or a delamination phenomenon may occur due to expansion of the bubbles. Furthermore, if the gap G between the plurality of reinforcing portions 196 is too wide, an influence on improvement of buckling resistance and improvement of the strength of an edge portion may be insignificant.

Figure 16A:
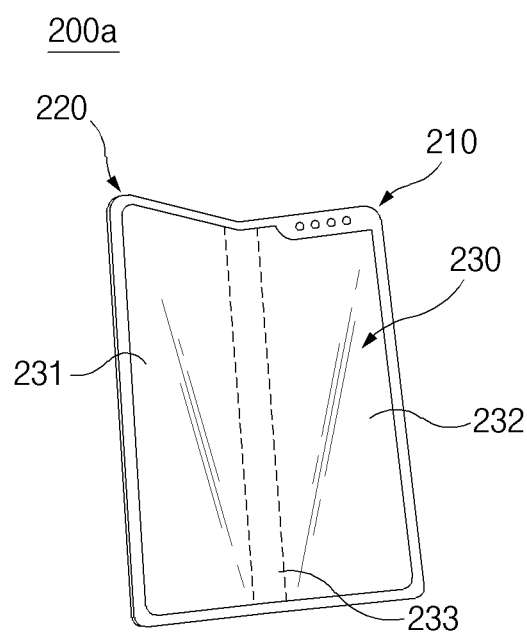
FIG. 16A is a view illustrating an example electronic device according to various embodiments.
Figure 16B:
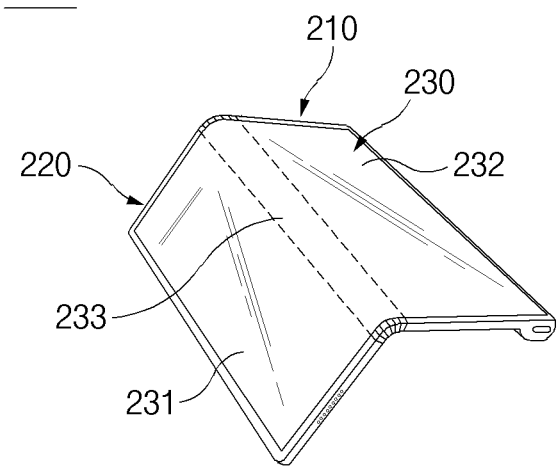
FIG. 16B is a view illustrating an example electronic device according to various embodiments.
Figure 17:
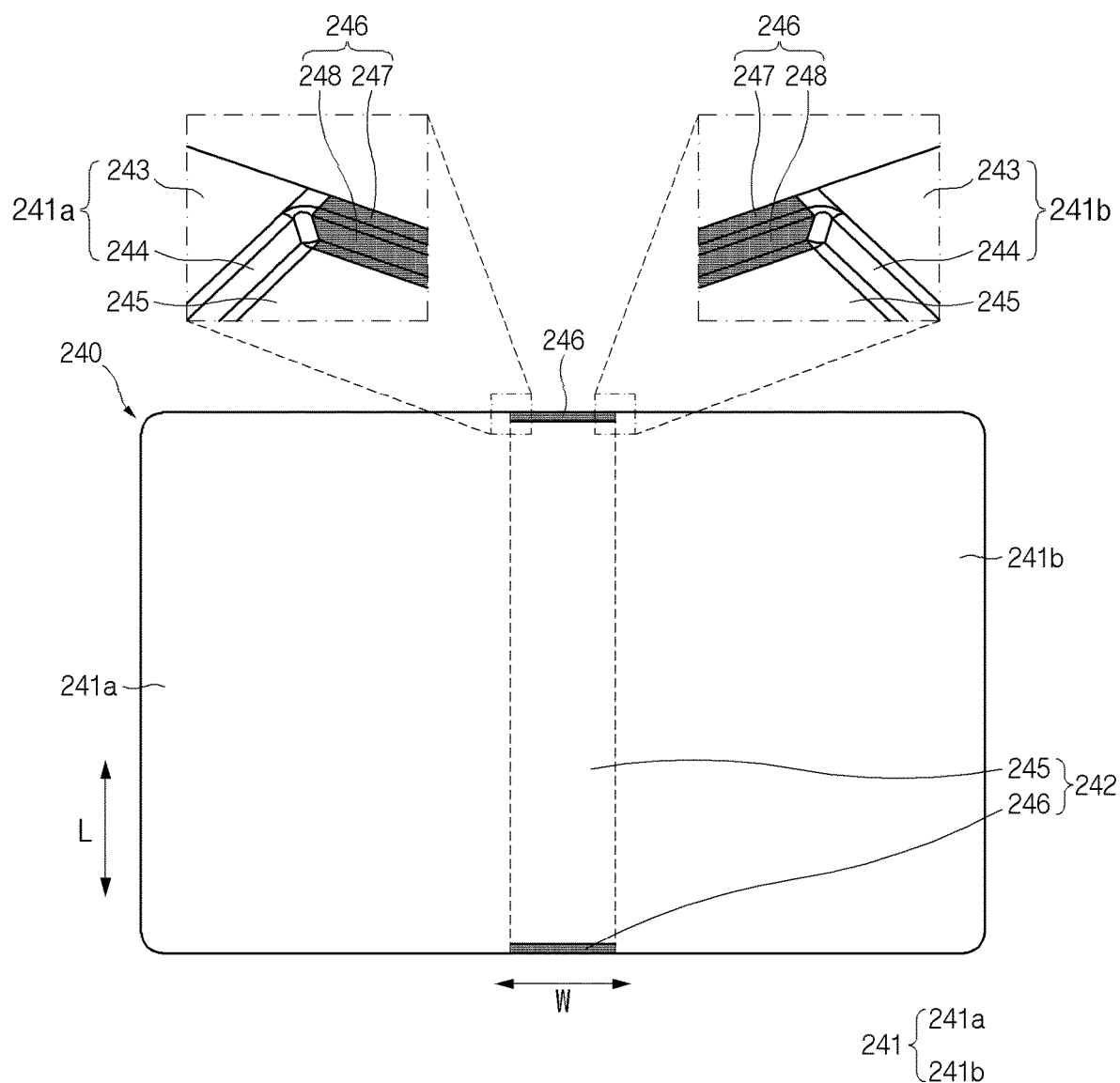
FIG. 17 is a view illustrating a cover layer of a display included in the example electronic devices of FIGS. 16A and 16B.

FIG. 16A is a view illustrating an example electronic device according to various embodiments. FIG. 16B is a view illustrating an example electronic device according to various embodiments. FIG. 17 is a view illustrating a cover layer of a display included in the example electronic devices of FIGS. 16A and 16B.

FIGS. 16A and 16B illustrate the foldable electronic devices 200a and 200b. For example, FIG. 16A illustrates the foldable electronic device 200a of an in-folding type, and FIG. 16B illustrates the foldable electronic device 200b of an out-folding type.

The previous drawings illustrate various embodiments of the flexible display included in the slidable electronic device (e.g., the slidable electronic device 100 of FIGS. 1 and 2) and the cover layer included in the flexible display, and the disclosed embodiments have been described based on the slidable electronic device 100. However, the thickness variation structure of the cover layer is not limited to the slidable electronic device 100 and may be applied to various types of electronic devices including a flexible display.

Hereinafter, a cover layer 240 applied to a flexible display 230 of the foldable electronic device 200a or 200b will be described with reference to FIGS. 16A, 16B, and 17.

Referring to FIGS. 16A and 16B, the foldable electronic device 200a or 200b according to an embodiment may include a first housing 210, a second housing 220 connected to the first housing 210 so as to be rotatable, and the display 230 disposed in the first housing 210 and the second housing 220 and formed to be foldable. Although not illustrated, the first housing 210 and the second housing 220 may be connected by a hinge so as to be rotatable.

As illustrated in FIG. 16A, the foldable electronic device 200a of an in-folding type may be folded inward such that one part of one surface of the display 230 on which a screen is displayed partially faces another part. As illustrated in FIG. 16B, the foldable electronic device 200b of an out-folding type may be folded outward such that one part of an opposite surface facing away from the one surface of the display 230 on which the screen is displayed partially faces another part.

The display 230 may include a pair of fixed parts 231 and 232 that are not deformed in folding and unfolding operations of the foldable electronic device 200a or 200b and a variable part 233 disposed between the pair of fixed parts 231 and 232 and partially deformed in the folding and unfolding operations of the foldable electronic device 200a or 200b. For example, the display 230 may include the first fixed part 231 that is at least partially disposed in the first housing 210 and that remains substantially flat, the second fixed part 232 that is at least partially disposed in the second housing 220 and that remains substantially flat, and the variable part 233 disposed between the first fixed part 231 and the second fixed part 232 and deformed to be flat or curved. According to various embodiments, the first fixed part 231, the second fixed part 232, and the variable part 233 may be referred to as a first flat part, a second flat part, and a folding part or a bending part, respectively.

The foldable electronic device 200a or 200b may be folded or unfolded about a folding axis FA. The first housing 210 and the second housing 220 may be folded or unfolded about the folding axis FA. The folding axis FA may refer, for example, to a central axis about which the display 230 is folded or unfolded. For example, when the display 230 is viewed from above, the folding axis FA may overlap the folding part 233 of the display 230, and the display 230 may be folded or unfolded about the folding axis FA.

According to various embodiments, the foldable electronic device 200a or 200b may be changed to a folded state in which the variable part 233 is curved and an unfolded state in which the variable part 233 is flat. For example, when the foldable electronic device 200a or 200b is in the folded state, the variable part 233 may form a curved surface having a predetermined curvature, and the first fixed part 231 and the second fixed part 232 may be disposed while forming a predetermined included angle. When the foldable electronic device 200a or 200b is in the unfolded state, the variable part 233 may form substantially the same plane as the first fixed part 231 and the second fixed part 232, and the first fixed part 231 and the second fixed part 232 may be disposed side by side to face in the same direction.

The display 230 of the foldable electronic device 200a or 200b may have a structure substantially the same as the stacked structure of the display described with reference to FIG. 4 (e.g., the display 130 of FIG. 4). For example, the display 230 may include a panel layer (e.g., the panel layer 140 of FIG. 4), a reinforcing layer (e.g., the reinforcing layer 150 of FIG. 4), a cover layer (e.g., the cover layer 160 of FIG. 4), and a protective layer (e.g., the protective layer 170 of FIG. 4).

FIG. 17 is a plan view of one surface (e.g., the first surface 160a of the cover layer 160 of FIG. 4) of the cover layer 240 facing the panel layer 140 as viewed from above.

Referring to FIG. 17, the cover layer 240 included in the display 230 of the foldable electronic device 200a or 200b may include a pair of first portions 241 and a second portion 242 disposed between the pair of first portions 241. In the folding and unfolding operations of the foldable electronic device 200a or 200b, the pair of first portions 241 may be fixedly maintained without being deformed, and the second portion 242 may be deformed. For example, when the display 230 is folded or unfolded to correspond to a state of the foldable electronic device 200a or 200b, the pair of first portions 241 may remain flat without being deformed, and the second portion 242 may be deformed to flat or curved.

The cover layer 240 of the foldable electronic device 200a or 200b may be formed such that the thickness varies in a first direction from the first fixed part 231 to the second fixed part 232 of the display 230 and a second direction that is perpendicular to the first direction and in which the variable part 233 extends. For example, the first direction may be a width direction W, and the second direction may be a lengthwise direction L. For example, the second direction and the lengthwise direction L may be parallel to the folding axis FA of the display 230.

The pair of first portions 241 may correspond to the fixed parts 231 and 232 of the display 230 that have a fixed shape, and the second portion 242 may correspond to the variable part 233 of the display 230 that has a variable shape. The first portions 241 may include a first sub-portion 241a corresponding to the first fixed part 231 and a second sub-portion 241b corresponding to the second fixed part 232. The second portion 242 may be disposed between the first sub-portion 241a and the second sub-portion 241b. For example, the first sub-portion 241a of the cover layer 240 may be a portion (or section) included in the first fixed part 231 of the display 230, the second sub-portion 241b of the cover layer 240 may be a portion (or section) included in the second fixed part 232 of the display 230, and the second portion 242 of the cover layer 240 may be a portion (or section) included in the variable part 233 of the display 230.

Each of the pair of first portions 241 may include a first base portion 243 and a first connecting portion 244 that extends from the first base portion 243 and that is connected with the second portion 242. The first connecting portion 244 may connect the first base portion 243 and the second portion 242 and may have a gradually decreasing thickness toward the second portion 242. The first base portion 243 and the first connecting portion 244 may correspond to the first base portion (e.g., the first base portion 163 of FIG. 6) and the first connecting portion (e.g., the first connecting portion 164 of FIG. 6) of the cover layer illustrated in FIGS. 5 and 6 (e.g., the cover layer 160 of FIGS. 5 and 6).

The second portion 242 may include a second base portion 245 and reinforcing portions 246 protruding from opposite edge portions of the second base portion 245 that face away from each other in the lengthwise direction. Each of the reinforcing portions 246 may include an edge portion 247 that forms an edge of the second portion 242 in the lengthwise direction L and a second connecting portion 248 that extends from the edge portion 247 and that is connected to a surface of the second base portion 245. The second connecting portion 248 may connect the edge portion 247 and the surface of the second base portion 245 and may have a gradually decreasing thickness from the edge portion 247 toward the surface of the second base portion 245. The second base portion 245, the edge portion 247, and the second connecting portion 248 may correspond to the second base portion (e.g., the second base portion 165 of FIGS. 5 and 6), the edge portion (e.g., the edge portion 167 of FIG.

6), and the second connecting portion (e.g., the second connecting portion 168 of FIG. 6) of the cover layer 240 illustrated in FIGS. 5 and 6.

The cover layer 240 of the foldable electronic device 200a or 200b may be configured such that a thickness change occurs in a direction perpendicular to the folding axis FA through a difference in thickness between the first portions 241 and the second portion 242 and a thickness change occurs in the direction of the folding axis FA through the reinforcing portions 246 formed on the second portion 242.

The previous descriptions of the various embodiments of the cover layer included in the slidable electronic device 100 may be applied to the cover layer 240 included in the foldable electronic device 200a or 200b.

Figure 18:
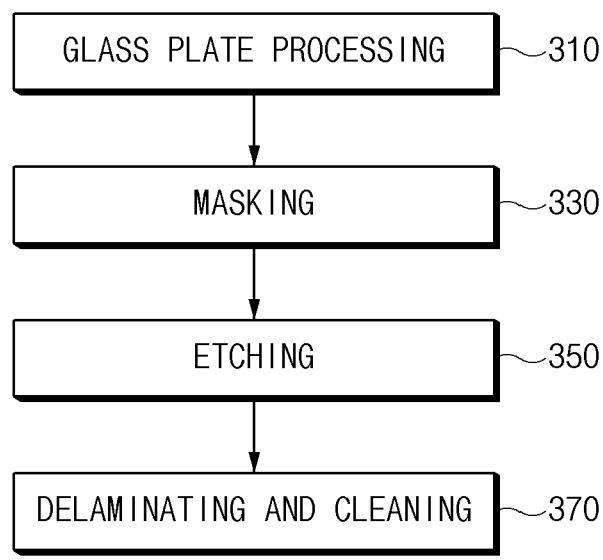
FIG. 18 is a flowchart illustrating an example method of manufacturing a cover layer of a display according to various embodiments.
Figure 19:
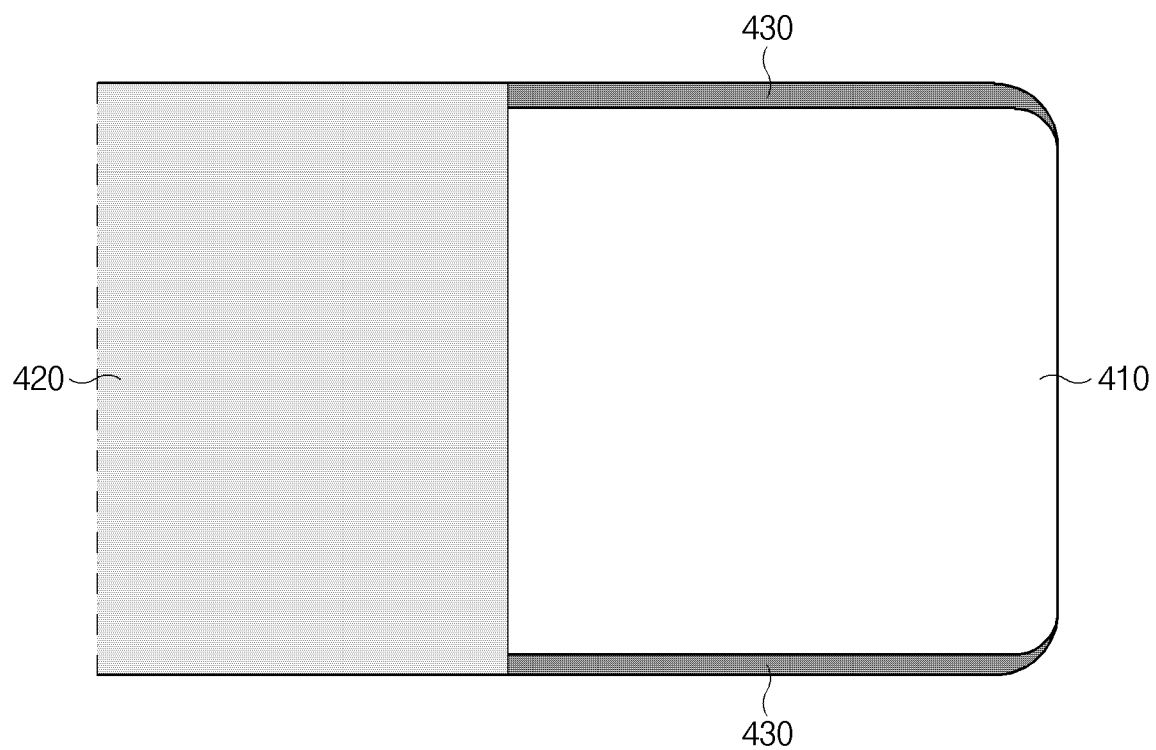
FIG. 19 is a view illustrating an operation of the example manufacturing method of FIG. 18.
Figure 20A:
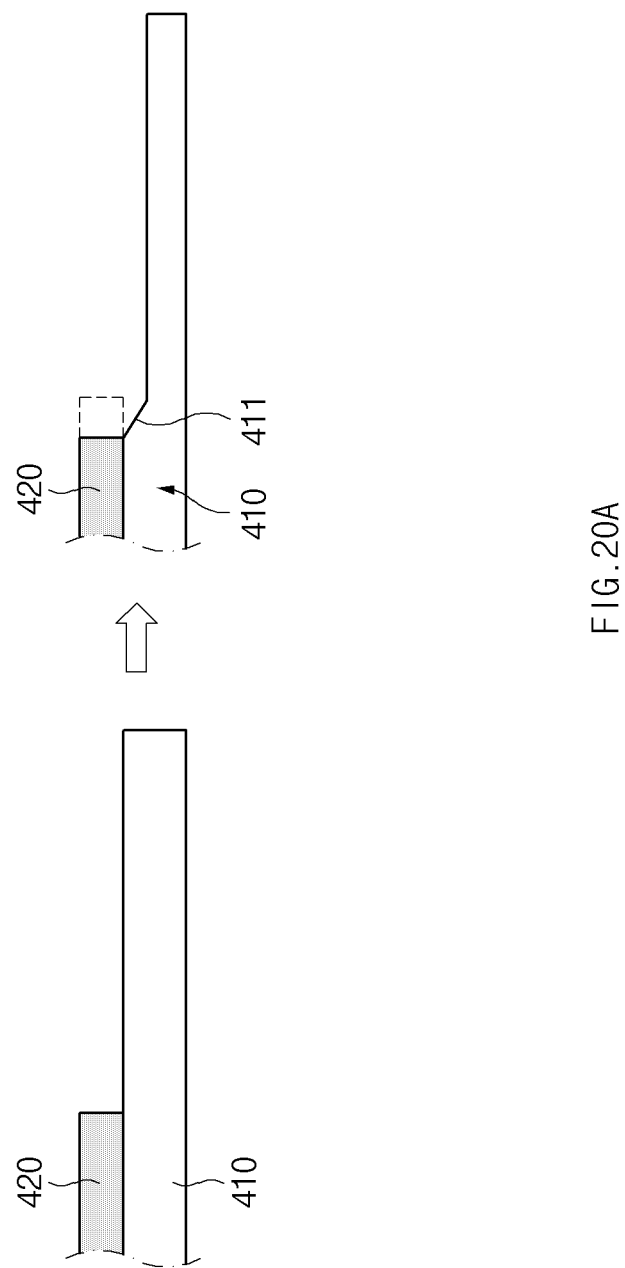
FIG. 20A is a view illustrating an operation of the example manufacturing method of FIG. 18.
Figure 20B:
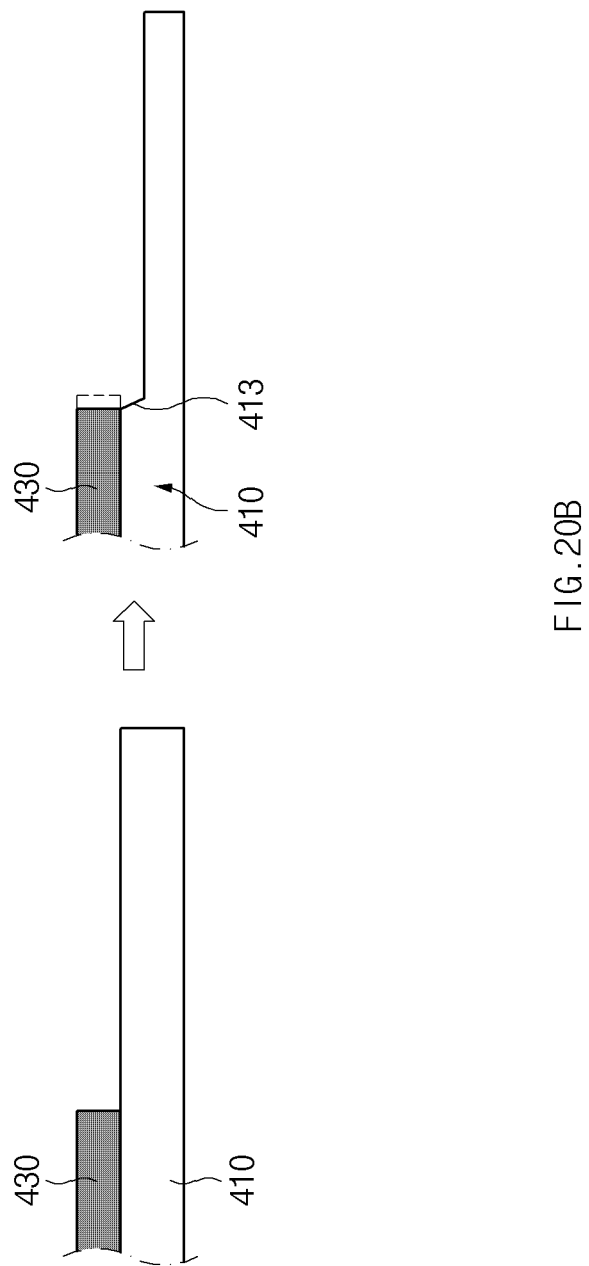
FIG. 20B is a view illustrating an operation of the example manufacturing method of FIG. 18.

FIG. 18 is a flowchart illustrating an example method of manufacturing an example cover layer of a display according to various embodiments. FIG. 19 is a view illustrating an operation of the example manufacturing method of FIG. 18. FIG. 20A is a view illustrating an operation of the example manufacturing method of FIG. 18. FIG. 20B is a view illustrating an operation of the example manufacturing method of FIG. 18.

FIG. 19 illustrates an example masking operation 330 in the example manufacturing method 300 of FIG. 18. FIGS. 20A and 20B illustrate an example etching operation 350 in the example manufacturing method 300 of FIG. 18.

Referring to FIG. 18, the method 300 of manufacturing a cover layer (e.g., the cover layer 160 of FIGS. 5, 6, 7A, and 7B) according to an embodiment may include an operation 310 of processing a glass plate, a masking operation 330, an etching operation 350, and an operation 370 of delaminating masking and cleaning the glass plate.

In the operation 310 of processing the glass plate, the glass plate may be processed in a desired shape to correspond to the width and length of the display (e.g., the display 130 of FIGS. 1 and 2 or the display 230 of FIGS. 16A and 16B). The processed glass plate may have a uniform thickness.

In the masking operation 330, a portion of the processed glass plate that is to be formed relatively thick may be masked using an acid resistant and/or alkali resistant coating solution. For example, masking may be performed by applying a coating solution to portions that correspond to a first portion (e.g., the first portion 161 of FIGS. 5, 6, 7A, and 7B) and reinforcing portions (e.g., the reinforcing portions 166 of FIGS. 5, 6, 7A, and 7B) of the cover layer 160.

Referring to FIG. 19 representing the masking operation 330, a first coating solution 420 may be applied to a region of the glass plate 410 that corresponds to the first portion 161, and a second coating solution 430 may be applied to regions corresponding to the reinforcing portions 166. For example, a region to which no coating solution is applied may be a region that corresponds to a second base portion (e.g., the second base portion 165 of FIGS. 5, 6, 7A, and 7B) of a second portion (e.g., the second portion 162 of FIGS. 5, 6, 7A, and 7B). The first coating solution 420 and the second coating solution 430 may have different chemical resistances. For example, the inclination of the first portion 161 (e.g., the first inclined surface 164s of FIG. 7B) and the inclination of the reinforcing portions 166 (e.g., the second inclined surface 168s of FIG. 7A) may be formed to be different from each other by masking the glass plate using the first coating solution 420 and the second coating solution 430 having different chemical resistances.

In the etching operation 350, the glass plate subjected to the masking may be soaked or dipped in an etching solution. The thickness of the remaining portion of the glass plate other than the masked portion may be uniformly reduced. In the etching operation 350, the glass plate may be processed in a form in which the masked portion and the unmasked portion have different thicknesses. Various acidic or basic solutions may be used as the etching solution. For example, ammonium fluoride ($NH_4F$), sulfuric acid ($H_2SO_4$), nitric acid ($HNO_3$), fluoro silicic acid ($H_2SiF_6$), sodium hydroxide (NaOH), or hydrofluoric acid (HF) may be used as the etching solution. The manufacturing method 300 may adjust the width and thickness of a relatively thick portion (e.g., the first portion 161 or the reinforcing portions 166) of the cover layer 160 based on a masking area and etching time.

Referring to FIGS. 20A and 20B representing the etching operation 350, when the etching operation 350 is performed, different inclinations may be formed depending on the chemical resistances of the coating solutions. For example, the first coating solution 420 applied to the region corresponding to the first portion 161 may be a coating solution having a lower chemical resistance than the second coating solution 430 applied to the regions corresponding to the reinforcing portions 166. Since the first coating solution 420 and the second coating solution 430 have different chemical resistances, the first coating solution 420 may be delaminated more than the second coating solution 430 while the masked glass plate 410 is dipped in a specific etching solution for a predetermined period of time. Accordingly, a portion of the glass plate from which the first coating solution 420 is delaminated may be corroded with a gentle slope (a small slope) 411, and a portion of the glass plate from which the second coating solution 430 is delaminated may be corroded with a steep slope (a large slope) 413. According to the etching operation illustrated in FIGS. 20A and 20B, the cover layer (e.g., the cover layer 160 of FIGS. 7A and 7B) in which the first inclined surface 164s of the first portion 161 has a smaller inclination angle than the second inclined surfaces 168s of the reinforcing portions 166 may be manufactured.

In the operation 370 of delaminating the masking and cleaning the glass plate, the masking remaining after the etching operation 350 may be removed, and the glass plate may be cleaned.

Figure 21:
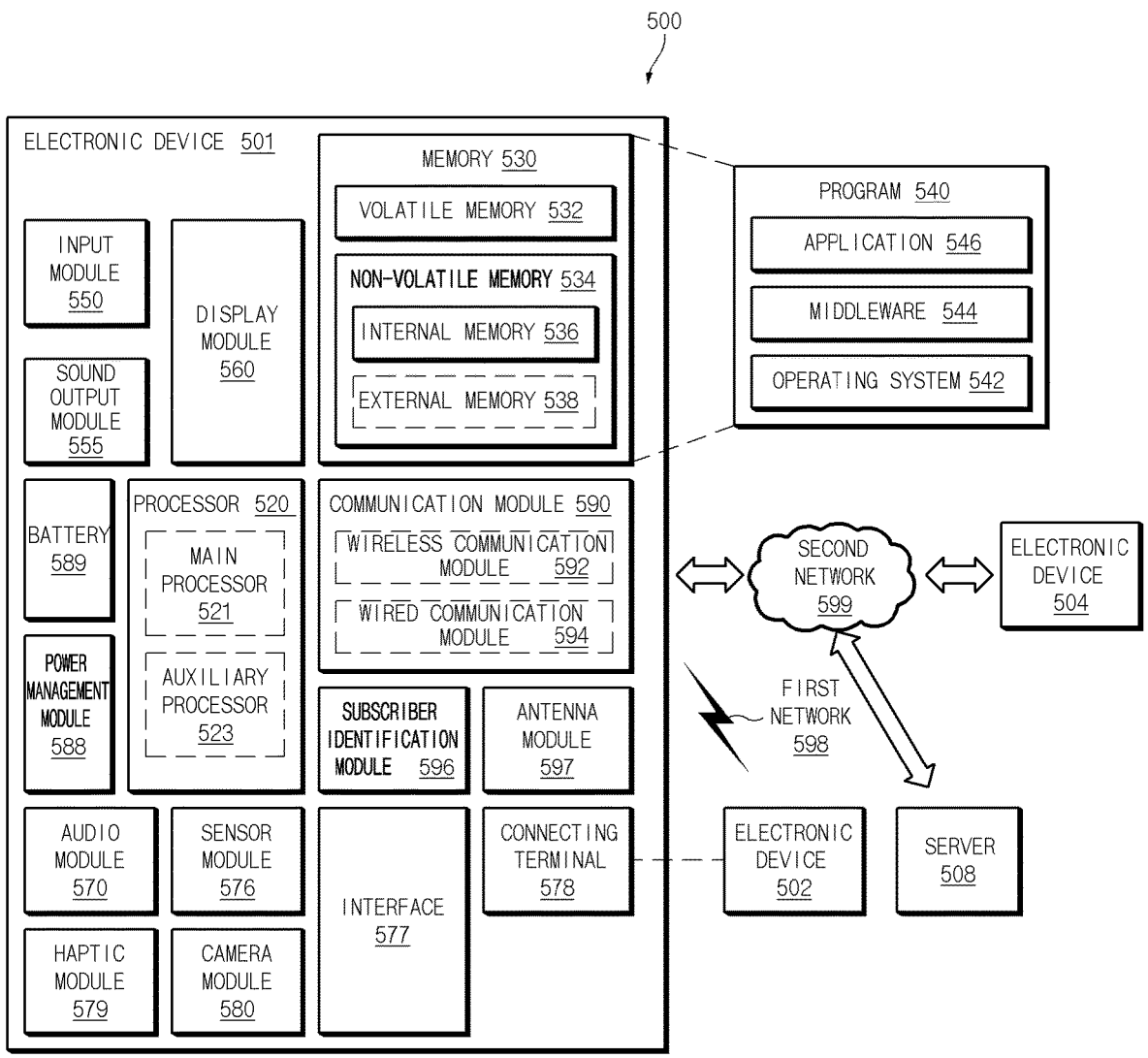
FIG. 21 is a block diagram of an example electronic device in a network environment according to various embodiments.

FIG. 21 is a block diagram of an example electronic device in a network environment according to various embodiments.

The electronic device 501 of FIG. 21 may be referred to as the slideable electronic device 100 of FIGS. 1 and 2 or the foldable electronic devices 200a and 200b of FIGS. 20A and 20B.

Referring to FIG. 21, the electronic device 501 in the network environment 500 may communicate with an electronic device 502 via a first network 598 (e.g., a short-range wireless communication network), or at least one of an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input module 550, a sound output module 555, a display module 560, an audio module 570, a sensor module 576, an interface 577, a connecting terminal 578, a haptic module 579, a camera module 580, a power management module 588, a battery 589, a communication module 590, a subscriber identification module (SIM) 596, or an antenna module 597. In various embodiments, at least one of the components (e.g., the connecting terminal 578) may be omitted from the electronic device 501, or one or more other components may be added in the electronic device 501. In various embodiments, some of the components (e.g., the sensor module 576, the camera module 580, or the antenna module 597) may be implemented as a single component (e.g., the display module 560).

The processor 520 may execute, for example, software (e.g., a program 540) to control at least one other component (e.g., a hardware or software component) of the electronic device 501 coupled with the processor 520, and may perform various data processing or computation. According to an embodiment, as at least part of the data processing or computation, the processor 520 may store a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), or an auxiliary processor 523 (e.g., a graphics processing unit (GPU), a neural processing unit (NPU), an image signal processor (ISP), a sensor hub processor, or a communication processor (CP)) that is operable independently from, or in conjunction with, the main processor 521. For example, when the electronic device 501 includes the main processor 521 and the auxiliary processor 523, the auxiliary processor 523 may be adapted to consume less power than the main processor 521, or to be specific to a specified function. The auxiliary processor 523 may be implemented as separate from, or as part of, the main processor 521.

The auxiliary processor 523 may control at least some of functions or states related to at least one component (e.g., the display module 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523. According to an embodiment, the auxiliary processor 523 (e.g., the neural processing unit) may include a hardware structure specified for artificial intelligence model processing. An artificial intelligence model may be generated by machine learning. Such learning may be performed, e.g., by the electronic device 501 where the artificial intelligence is performed or via a separate server (e.g., the server 508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof, but is not limited thereto. The artificial intelligence model may, additionally or alternatively, include a software structure other than the hardware structure. The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input module 550 may receive a command or data to be used by another component (e.g., the processor 520) of the electronic device 501, from the outside (e.g., a user) of the electronic device 501. The input module 550 may include, for example, a microphone, a mouse, a keyboard, a key (e.g., a button), or a digital pen (e.g., a stylus pen).

The sound output module 555 may output sound signals to the outside of the electronic device 501. The sound output module 555 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 560 may visually provide information to the outside (e.g., a user) of the electronic device 501. The display module 560 may include, for example, a display, a hologram device, or a projector and control circuitry to control a corresponding one of the display, hologram device, and projector. According to an embodiment, the display module 560 may include a touch sensor adapted to detect a touch, or a pressure sensor adapted to measure the intensity of force incurred by the touch.

The audio module 570 may convert a sound into an electrical signal and vice versa. According to an embodiment, the audio module 570 may obtain the sound via the input module 550, or output the sound via the sound output module 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device (e.g., the electronic device 502). According to an embodiment, the connecting terminal 578 may include, for example, a HDMI connector, a USB connector, a SD card connector, or an audio connector (e.g., a headphone connector).

The haptic module 579 may convert an electrical signal into a mechanical stimulus (e.g., a vibration or a movement) or electrical stimulus which may be recognized by a user via his/her tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to an embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the application processor (AP)) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or infrared data association (IrDA)) or the second network 599 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The wireless communication module 592 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 592 may support a high-frequency band (e.g., the mmWave band) to achieve, e.g., a high data transmission rate. The wireless communication module 592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 592 may support various requirements specified in the electronic device 501, an external electronic device (e.g., the electronic device 504), or a network system (e.g., the second network 599). According to an embodiment, the wireless communication module 592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 597 may transmit or receive a signal or power to or from the outside (e.g., the external electronic device) of the electronic device 501. According to an embodiment, the antenna module 597 may include an antenna including a radiating element composed of or including a conductive material or a conductive pattern formed in or on a substrate (e.g., a printed circuit board (PCB)). According to an embodiment, the antenna module 597 may include a plurality of antennas (e.g., array antennas). In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

According to various embodiments, the antenna module 597 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the electronic devices 502 or 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, mobile edge computing (MEC), or client-server computing technology may be used, for example. The electronic device 501 may provide ultra low-latency services using, e.g., distributed computing or mobile edge computing. In an embodiment, the external electronic device 504 may include an internet-of-things (IoT) device. The server 508 may be an intelligent server using machine learning and/or a neural network. According to an embodiment, the external electronic device 504 or the server 508 may be included in the second network 599. The electronic device 501 may be applied to intelligent services (e.g., smart home, smart city, smart car, or healthcare) based on 5G communication technology or IoT-related technology.

A flexible display 130 according to an example embodiment may include a panel layer 140 and a cover layer 160 disposed on one surface of the panel layer. The cover layer may include a first portion 161 and a second portion 162 that extends from the first portion in a first direction. The first portion may include a first base portion 163 having a first thickness T1 and a first connecting portion 164 that extends from the first base portion and has a gradually decreasing thickness. The second portion may include a second base portion 165 that is connected with the first connecting portion and that has a second thickness T2 smaller than the first thickness and a reinforcing portion 166 that protrudes from an edge of the second base portion that faces in a second direction perpendicular to the first direction. The reinforcing portion may include an edge portion 167 that protrudes from a partial region of the second base portion to have a third thickness T3 and a second connecting portion 168 that extends from the edge portion toward the second base portion and has a gradually decreasing thickness.

In an example embodiment, the first connecting portion may include a first inclined surface 164s that obliquely connects a surface 163s of the first base portion and a surface 165s of the second base portion, and the second connecting portion may include a second inclined surface 168s that obliquely connects a surface 167s of the edge portion and the surface of the second base portion.

In an example embodiment, the first inclined surface may have a first inclination angle A1, and the second inclined surface may have a second inclination angle A2 different from the first inclination angle.

In an example embodiment, the first inclination angle may be smaller than the second inclination angle.

In an example embodiment, the first thickness of the first base portion may be substantially the same as a sum of the second thickness of the second base portion and the third thickness of the edge portion.

In an example embodiment, the reinforcing portion may be connected to the first portion such that the edge portion forms the same plane as the first base portion.

In an example embodiment, the first thickness of the first base portion 183 may be greater than the sum of the second thickness of the second base portion 185 and the third thickness of the edge portion 187.

In an example embodiment, the first base portion may further protrude beyond the edge portion by a first height $H_1$ based on the second base portion, and the first height may be equal to the first thickness minus the sum of the second thickness and the third thickness.

In an example embodiment, the flexible display may further include a reinforcing layer 150 disposed between the panel layer and the cover layer, and the reinforcing layer may be formed in a shape corresponding to a thickness change of the cover layer.

In an example embodiment, the reinforcing portion 196 may include a plurality of protrusions $196_1$, $196_2$, and $196_3$ which are spaced apart from each other by a specified gap in the first direction.

In an example embodiment, the flexible display may further include a reinforcing layer 150 disposed between the panel layer and the cover layer, and the reinforcing layer may include a plurality of depressions 150r corresponding to the plurality of protrusions.

In an example embodiment, the first portion may remain substantially flat, and the second portion may be partially deformed to be flat or curved.

A slidable electronic device 100 according to an example embodiment of the disclosure may include a first structure 110, a second structure 120 connected to the first structure so as to slide, and a display 130 configured such that a size of a region exposed on a front surface of the electronic device is changed in response to sliding of the second structure relative to the first structure, the display being formed in a structure in which a plurality of layers are stacked. The plurality of layers may include a panel layer 140 and a cover layer 160 disposed on one surface of the panel layer, and the cover layer may include a first portion 161 and a second portion 162 that extends from the first portion in a first direction. The first portion may include a first base portion 163 having a first thickness T1 and a first connecting portion 164 that extends from the first base portion and has a gradually decreasing thickness, and the second portion may include a second base portion 165 that is connected with the first connecting portion and that has a second thickness smaller than the first thickness and a reinforcing portion 166 that protrudes from an edge of the second base portion that faces in a second direction perpendicular to the first direction. The reinforcing portion may include an edge portion 167 that protrudes from a partial region of the second base portion to have a third thickness T3 and a second connecting portion 168 that extends from the edge portion toward the second base portion and has a gradually decreasing thickness.

In an example embodiment, the first connecting portion may include a first inclined surface 164s that obliquely connects a surface 163s of the first base portion and a surface 165s of the second base portion, and the second connecting portion may include a second inclined surface 168s that obliquely connects a surface 167s of the edge portion and the surface of the second base portion.

In an example embodiment, the first inclined surface may have a first inclination angle A1, and the second inclined surface may have a second inclination angle A2 different from the first inclination angle.

In an example embodiment, the display may include a fixed part 132, the shape of which is fixedly maintained when the second structure slides, and a variable part (e.g., a rollable part or a rolling part) 134 that extends from the fixed part and that is deformed to be flat or curved in response to sliding of the second structure. The first portion may be included in the fixed part of the display, and the second portion may be included in the variable part of the display.

In an example embodiment, the first direction may be substantially parallel to sliding directions S1 and S2 in which the second structure slides relative to the first structure.

A foldable electronic device 200a or 200b according to an example embodiment of the disclosure may include a first housing 210, a second housing 220 connected to the first housing so as to be rotatable, and a display 230 disposed in the first housing and the second housing and partially folded or unfolded in response to relative rotation of the first housing and the second housing, the display being formed in a structure in which a plurality of layers are stacked. The plurality of layers may include a panel layer 140 and a cover layer 160 or 240 disposed on one surface of the panel layer, and the cover layer may include a first portion 161 or 241 and a second portion 162 or 242 that extends from the first portion in a first direction. The first portion may include a first base portion 163 or 243 having a first thickness T1 and a first connecting portion 164 or 244 that extends from the first base portion and has a gradually decreasing thickness, and the second portion may include a second base portion 165 or 245 that is connected with the first connecting portion and that has a second thickness T2 smaller than the first thickness and a reinforcing portion 166 or 246 that protrudes from an edge of the second base portion that faces in a second direction perpendicular to the first direction. The reinforcing portion may include an edge portion 167 or 247 that protrudes from a partial region of the second base portion to have a third thickness T3 and a second connecting portion 168 or 248 that extends from the edge portion toward the second base portion and has a gradually decreasing thickness.

In an example embodiment, the first connecting portion may include a first inclined surface 164s that obliquely connects a surface 163s of the first base portion and a surface 165s of the second base portion, and the second connecting portion may include a second inclined surface 168s that obliquely connects a surface 167s of the edge portion and the surface of the second base portion.

In an example embodiment, the first inclined surface may have a first inclination angle A1, and the second inclined surface may have a second inclination angle A2 different from the first inclination angle.

In an example embodiment, the display may include a first fixed part 231 at least partially disposed in the first housing and formed to be flat, a second fixed part 232 at least partially disposed in the second housing and formed to be flat, and a variable part (e.g., a foldable part or a folding part) 233 disposed between the first fixed part and the second fixed part. The first portion may be included in the first fixed part and the second fixed part of the display, and the second portion may be included in the variable part of the display.

In an example embodiment, the first portion may include a first sub-portion 241a corresponding to the first fixed part and a second sub-portion 241b corresponding to the second fixed part, and the second portion may be disposed between the first sub-portion and the second sub-portion.

In an example embodiment, the first direction may be substantially perpendicular to a folding axis FA of the display, and the second direction may be substantially parallel to the folding axis of the display.

In an example embodiment, the first direction may be substantially parallel to a direction in which the first fixed part and the second fixed part extend from opposite sides of the variable part.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and do not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium, where the term "non-transitory" refers to the storage medium being a tangible device, and does not include a signal (e.g., an electromagnetic wave), but this term does not differentiate between data being semi-permanently stored in the storage medium and the data being temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those of ordinary skill in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A flexible display comprising:
a panel layer; and
a cover layer disposed on one surface of the panel layer,
wherein the cover layer includes a first portion and a second portion configured to extend from the first portion in a first direction,
wherein the first portion includes a first base portion having a first thickness and a first connecting portion configured to extend from the first base portion and having a gradually decreasing thickness,
wherein the second portion includes a second base portion connected with the first connecting portion and having a second thickness smaller than the first thickness and a reinforcing portion configured to protrude from an edge of the second base portion configured to face in a second direction perpendicular to the first direction, and
wherein the reinforcing portion includes an edge portion configured to protrude from a partial region of the second base portion to have a third thickness and a second connecting portion configured to extend from the edge portion toward the second base portion and having a gradually decreasing thickness.

2. The flexible display of claim 1, wherein the first connecting portion includes a first inclined surface configured to obliquely connect a surface of the first base portion and a surface of the second base portion, and wherein the second connecting portion includes a second inclined surface configured to obliquely connect a surface of the edge portion and the surface of the second base portion.

3. The flexible display of claim 2, wherein the first inclined surface has a first inclination angle, and
wherein the second inclined surface has a second inclination angle different from the first inclination angle.

4. The flexible display of claim 3, wherein the first inclination angle is smaller than the second inclination angle.

5. The flexible display of claim 1, wherein the first thickness of the first base portion is substantially the same as a sum of the second thickness of the second base portion and the third thickness of the edge portion.

6. The flexible display of claim 5, wherein the reinforcing portion is connected to the first portion such that the edge portion forms the same plane as the first base portion.

7. The flexible display of claim 1, wherein the first thickness of the first base portion is greater than a sum of the second thickness of the second base portion and the third thickness of the edge portion.

8. The flexible display of claim 7, wherein the first base portion further protrudes beyond the edge portion by a first height based on the second base portion, and
wherein the first height is equal to the first thickness minus the sum of the second thickness and the third thickness.

9. The flexible display of claim 1, further comprising:
a reinforcing layer disposed between the panel layer and the cover layer,
wherein the reinforcing layer is formed in a shape corresponding to a thickness change of the cover layer.

10. The flexible display of claim 1, wherein the reinforcing portion includes a plurality of protrusions spaced apart from each other by a specified gap in the first direction.

11. The flexible display of claim 10, further comprising:
a reinforcing layer disposed between the panel layer and the cover layer,
wherein the reinforcing layer includes a plurality of depressions corresponding to the plurality of protrusions.

12. The flexible display of claim 1, wherein the first portion remains substantially flat, and
wherein the second portion is partially deformed to be flat or curved.

13. A slidable electronic device comprising:
a first structure;
a second structure connected to the first structure so as to slide; and
a display configured such that a size of a region exposed on a front surface of the electronic device is changed in response to sliding of the second structure relative to the first structure, the display being formed in a structure in which a plurality of layers are stacked,
wherein the plurality of layers includes a panel layer and a cover layer disposed on one surface of the panel layer,
wherein the cover layer includes a first portion and a second portion configured to extend from the first portion in a first direction,
wherein the first portion includes a first base portion having a first thickness and a first connecting portion configured to extend from the first base portion and having a gradually decreasing thickness,
wherein the second portion includes a second base portion connected with the first connecting portion and having a second thickness smaller than the first thickness and a reinforcing portion configured to protrude from an edge of the second base portion configured to face in a second direction perpendicular to the first direction, and wherein the reinforcing portion includes an edge portion configured to protrude from a partial region of the second base portion to have a third thickness and a second connecting portion configured to extend from the edge portion toward the second base portion and having a gradually decreasing thickness.

14. The slidable electronic device of claim 13, wherein the first connecting portion includes a first inclined surface configured to obliquely connect a surface of the first base portion and a surface of the second base portion, and wherein the second connecting portion includes a second inclined surface configured to obliquely connect a surface of the edge portion and the surface of the second base portion.

15. The slidable electronic device of claim 14, wherein the first inclined surface has a first inclination angle, and wherein the second inclined surface has a second inclination angle different from the first inclination angle.

16. The slidable electronic device of claim 13, wherein the display includes a fixed part, the shape of which is fixedly maintained when the second structure slides, and a variable part configured to extend from the fixed part and deformed to be flat or curved in response to sliding of the second structure, wherein the first portion is included in the fixed part of the display, and wherein the second portion is included in the variable part of the display.

17. A foldable electronic device comprising:

a first housing;

a second housing connected to the first housing so as to be rotatable; and a display disposed in the first housing and the second housing and configured to be partially folded or unfolded in response to relative rotation of the first housing and the second housing, the display being formed in a structure in which a plurality of layers are stacked, wherein the plurality of layers includes a panel layer and a cover layer disposed on one surface of the panel layer, wherein the cover layer includes a first portion and a second portion configured to extend from the first portion in a first direction, wherein the first portion includes a first base portion having a first thickness and a first connecting portion configured to extend from the first base portion and having a gradually decreasing thickness, wherein the second portion includes a second base portion connected with the first connecting portion and having a second thickness smaller than the first thickness and a reinforcing portion configured to protrude from an edge of the second base portion configured to face in a second direction perpendicular to the first direction, and wherein the reinforcing portion includes an edge portion configured to protrude from a partial region of the second base portion to have a third thickness and a second connecting portion configured to extend from the edge portion toward the second base portion and having a gradually decreasing thickness.

18. The foldable electronic device of claim 17, wherein the first connecting portion includes a first inclined surface configured to obliquely connect a surface of the first base portion and a surface of the second base portion, and wherein the second connecting portion includes a second inclined surface configured to obliquely connect a surface of the edge portion and the surface of the second base portion.

19. The foldable electronic device of claim 18, wherein the first inclined surface has a first inclination angle, and wherein the second inclined surface has a second inclination angle different from the first inclination angle.

20. The foldable electronic device of claim 17, wherein the display includes a first fixed part at least partially disposed in the first housing and formed to be flat, a second fixed part at least partially disposed in the second housing and formed to be flat, and a variable part disposed between the first fixed part and the second fixed part, wherein the first portion is included in the first fixed part and the second fixed part of the display, and wherein the second portion is included in the variable part of the display.

* * * * *